US012068353B2

(12) United States Patent
Stefanov

(10) Patent No.: US 12,068,353 B2
(45) Date of Patent: Aug. 20, 2024

(54) IMAGING DEVICE

(71) Applicant: TELEDYNE UK LIMITED, Chelmsford (GB)

(72) Inventor: Konstantin Stefanov, Milton Keynes (GB)

(73) Assignee: TELEDYNE UK LIMITED, Chelmsford (GB)

( * ) Notice: Subject to any disclaimer, the term of this patent is extended or adjusted under 35 U.S.C. 154(b) by 330 days.

(21) Appl. No.: 17/118,809

(22) Filed: Dec. 11, 2020

(65) Prior Publication Data

US 2021/0217799 A1  Jul. 15, 2021

(30) Foreign Application Priority Data

Dec. 20, 2019 (GB) ..................................... 1919089

(51) Int. Cl.
  *H01L 27/146* (2006.01)
  *H04N 25/70* (2023.01)
(52) U.S. Cl.
  CPC .. *H01L 27/14643* (2013.01); *H01L 27/14603* (2013.01); *H04N 25/70* (2023.01)
(58) Field of Classification Search
  CPC ........ H01L 27/14643; H01L 27/14603; H04N 5/369
  See application file for complete search history.

(56) References Cited

U.S. PATENT DOCUMENTS

| 8,928,792 B1 | 1/2015 | Hynecek et al. |
| 8,946,845 B1 | 2/2015 | Hynecek et al. |
| 2005/0224843 A1* | 10/2005 | Boemler ........... H01L 27/14609 348/E3.018 |
| 2008/0074524 A1* | 3/2008 | Panicacci ............... H04N 25/59 348/E3.019 |
| 2008/0217661 A1 | 9/2008 | Lauxtermann |
| 2016/0118424 A1* | 4/2016 | Guidash ........... H01L 27/14641 257/231 |
| 2017/0214878 A1* | 7/2017 | Van Der Tempel ........................ H04N 5/3559 |
| 2017/0257578 A1 | 9/2017 | Velichko et al. |

(Continued)

FOREIGN PATENT DOCUMENTS

| EP | 2346079 A1 | 7/2011 |
| GB | 2477083 A | 7/2011 |

OTHER PUBLICATIONS

United Kingdom Patent Office Search Report for Application No. GB 1919089.1 dated May 27, 2020, 1 page.

(Continued)

*Primary Examiner* — Thanh Luu
(74) *Attorney, Agent, or Firm* — K&L Gates LLP

(57) ABSTRACT

Imaging device comprising: a substrate; a pinned photodiode formed on the substrate, wherein the pinned photodiode generates charge that is representative of incident radiation, wherein the imaging device further comprises: circuitry defining a first path for measuring charge and configured to non-destructively produce a signal representative of the charge generated in the pinned photodiode; circuitry defining a subsequent second path for measuring charge and configured to produce a signal representative of the charge generated in the pinned photodiode, and wherein the first and second paths have different conversion gain.

20 Claims, 19 Drawing Sheets

(56) References Cited

U.S. PATENT DOCUMENTS

2018/0302582 A1* 10/2018 Roy ..................... H04N 5/353

OTHER PUBLICATIONS

Extended European Search Report for European Application No. 20214848.2 dated Apr. 9, 2021.
Tiffenberg et al., Single-Electron and Single-Photon Sensitivity with a Silicon Skipper CCD, Phys. Rev. Lett. 119, 131802, May 31, 2017, 7 pages.
Kim et al., A Dual-Capture Wide Dynamic Range CMOS Image Sensor Using Floating-Diffusion Capacitor, IEEE Transactions on Electron Devices, vol. 55, No. 10, Oct. 2008, pp. 2590-2594.

* cited by examiner

IMAGING DEVICE

FIELD

Embodiments described herein relate generally to devices and methods for imaging, particularly imaging using pinned photodiodes.

BACKGROUND

Imaging devices with high dynamic range (HDR) are used for imaging of scenes with large differences between the illumination levels, either within a single scene or between different operating conditions, such as imaging at night and during the day. Typical applications are in automotive imaging, surveillance, robotics, spectroscopy and astronomy. The dynamic range (DR) of a sensor is calculated as the maximum output signal over its RMS readout noise, and sensors with DR above 100 dB are generally considered to be in the HDR category.

Modern CMOS image sensors have high conversion gain (CG) in order to achieve low readout noise performance. For example, the CG could be between 50 µV and 100 µV per electron (µV/e−) or even higher, which allows the readout noise to be below 2 e−RMS. The output voltage signal from a pinned photodiode (PPD) rarely exceeds 2 V due to power supply limitations on the output swing, which corresponds to charge handling capacity of 20 ke− at CG=100 µV/e−. The dynamic range of such sensor, calculated as the maximum output signal over the RMS noise, would be 20 ke−/2 e−=104, or 80 dB.

This output signal can be significantly lower than the full well capacity of the PPD. A 10 µm PPD pixel can store more than 100 ke−, which would correspond to a dynamic range of 50000 (94 dB) at 2 e− noise. However, if CG=100 µV/e− is used as in the previous example, the output voltage swing would need to be 10 V, and this would saturate the output of the sensor. If a lower conversion gain is used to accommodate the larger output signal, the readout noise would increase too, limiting the achievable dynamic range.

Methods employed to achieve dynamic range above 100 dB in PPD CMOS image sensors include: taking and processing multiple images taken at different exposure times; dynamically changing the conversion gain of the sensor by allowing the excess charge to overflow into a capacitor; allowing the charged stored in the PPD to be transferred to one of two sense nodes having different conversion gains; and employing two separate photodiodes with different photosensitivity.

There is a continuing need to increase the DR of PPD-based CMOS image sensors above 100 dB while preserving their low noise performance.

SUMMARY

In an embodiment, an imaging device comprising: a substrate; and a pinned photodiode formed on the substrate, wherein the pinned photodiode generates charge that is representative of incident radiation, wherein the imaging device further comprises: circuitry defining a first path for measuring charge and configured to non-destructively produce a signal representative of the charge generated in the pinned photodiode; and circuitry defining a subsequent second path for measuring charge and configured to produce a signal representative of the charge generated in the pinned photodiode, wherein the first and second paths have different conversion gain.

For the avoidance of doubt, by non-destructively producing a signal representative of the charge generated in the pinned photodiode, it is meant that a signal is produced without removal of charge from the substrate. Thus, a non-destructive charge measurement permits further, subsequent measurement of the charge generated in the photodiode. The subsequent measurement may be made non-destructively or otherwise. The imaging device therefore allows several measurements of the same signal.

A pinned photodiode is a light sensitive (photodiode) region of a first doping type on a substrate of a second doping type with an implant ("pinning") layer of the second doping type formed over the photodiode region at the surface of the substrate, wherein the first and second doping types are of opposite polarity.

The conversion gain of a signal is the number of volts produced per electron.

More than two measurements of the charge generated in the pixel may be made.

In an embodiment, the subsequent second path is configured to destructively produce a signal representative of the charge generated in the pinned photodiode.

For the avoidance of doubt, destructively producing a signal means that the signal is produced by the non-reversible conversion of charge to voltage.

In an embodiment, the imaging device is configured to produce at least one non-destructive readout of the charge generated in the photodiode followed by a destructive readout. The imaging device may be configured to produce two or more non-destructive readouts of the charge generated in the photodiode.

The imaging device may be operable to produce only one signal via the first path or via the second path.

In an embodiment, the conversion gain of the second path may be higher than the conversion gain of the first path. In an embodiment, the conversion grain ratio of the second path is 2 to 20 times higher than the conversion gain ratio of the first path. In an embodiment, the conversion grain ratio of the second path is 5 to 10 times higher than the conversion gain ratio of the first path. The conversion gain ratio of the two paths may be approximately 10. Obtaining two signals with differing gains enables the sensor to have a high dynamic range.

The circuitry defining the first path and the circuitry defining the second path may be dedicated to the first and second paths respectively. Some of the circuitry defining the first path and the circuitry defining the second path may be common to both paths. Some components may be shared by both first and second paths. This enables space dedicated to the circuitry to be reduced and the size of the pinned photodiode to be increased.

In an embodiment, the circuitry defining the first path is circuitry configured to produce a signal representative of the charge generated in the pinned photodiode via capacitive coupling to charge in the substrate. In an embodiment, the circuitry defining the first path comprises: a sense gate electrode formed on the substrate and capacitively coupled to charge in the imaging device; and circuitry configured to measure the voltage change of the sense gate.

In an embodiment the sense gate electrode is a floating gate electrode. A floating gate electrode is a gate electrode which is electrically isolated.

In an embodiment, the circuitry defining the second path may comprise: a sense node formed on the substrate and configured to receive charge transferred from the pinned photodiode; and circuitry configured to measure the voltage change of the sense node, so as to enable measurement of charge transferred from the pinned photodiode.

The sense node comprises a region formed on the substrate of opposing polarity to the substrate.

In an embodiment, the imaging device may further comprise a first region of the substrate located between the pinned photodiode and the sense node; a first gate electrode formed on the substrate and configured to control the transfer of charge from the pinned photodiode to the first region; a second gate electrode formed on the substrate and configured to control the transfer of charge between the first region and the sense node, and wherein the sense gate electrode is formed on the first region of the substrate and capacitively coupled to charge in the first region.

The first region of the substrate may be of a first doping type and the first gate electrode and the second gate electrode may both be formed on a region of the substrate of the first doping type.

The pinned photodiode may be formed on a region of the substrate of the first doping type, thus enabling surface channel mode charge transfer between the pinned photodiode and the sense node and enabling straightforward manufacture of the imaging device.

The pinned photodiode may be formed on a region of the substrate of the second doping type, wherein the first and second doping types are of opposing polarity, thereby enabling buried channel mode charge transfer, thereby improving charge transfer efficiency between the pinned photodiode and the sense node.

The first region of the substrate may be a first doping type, the second gate electrode may formed on a region of the substrate having the first doping type and the first gate electrode may formed on a region of the substrate having a second doping type, wherein the first and second doping types are of opposing polarity, thus enabling buried channel mode charge transfer, thereby improving charge transfer efficiency between the pinned photodiode and the sense node.

In an embodiment, the first gate electrode and the second gate electrode are further configured to control the transfer of charge from the first region back to the pinned photodiode. Thus, the charge can be measured at the sense gate before being returned to the pinned photodiode for further charge generation. Thus, several measurements of the charge can be taken during the course of charge generation.

In an embodiment, the circuitry defining the first path comprises: a sense gate electrode formed on the substrate and capacitively coupled to charge in the imaging device; and circuitry configured to measure the voltage change of the sense gate, the circuitry defining the second path comprises: a sense node formed on the substrate and configured to receive charge transferred from the pinned photodiode; and circuitry configured to measure the voltage change of the sense node, so as to enable measurement of charge transferred from the pinned photodiode, and the circuitry defining the first path is configured to measure the charge generated in the pinned photodiode via capacitive coupling to the sense gate during charge collection in the pinned photodiode. Thus, several measurements of the charge may be made during charge collection.

In an embodiment, the imaging device comprises an array of pinned photodiodes and the circuitry defining a subsequent second path are operative to produce signals representative of the charge generated in at least one of the pinned photodiodes.

In an embodiment, the circuitry defining a first path and the circuitry defining a subsequent second path are common to more than one pinned photodiode, i.e. more than one pinned photodiode may share the same circuitry.

The imaging device may comprise circuitry defining first and second paths for producing signals representative of the charge generated in the photodiodes for each individual pinned photodiode (i.e. one set of circuitry is dedicated to a particular pinned photodiode) or circuitry may be common to more than one pinned photodiode, or a mixture of the two. In an embodiment, the circuitry defining a first path and the circuitry defining a subsequent second path are dedicated to one pinned photodiode, and each pinned photodiode has its own dedicated circuitry. In an embodiment, some of the charge measurement circuitry is common to more than one pinned photodiode and some of the charge measurement circuitry is dedicated to individual pinned photodiodes.

In an embodiment, the imaging device may be configured to discard the signal produced by the second path when the signal produced by the first path exceeds a threshold. This threshold may indicate that the signal produced by the second path is in saturation. Thus, the signal produced by the second path is discarded when it is in saturation.

The imaging device may be manufactured using CMOS techniques.

In an embodiment, a method of operating an imaging device is provided, the method comprising: receiving radiation incident on a pinned photodiode formed on a substrate; generating charge representative of the received radiation; non-destructively producing a first signal representative of the generated charge; producing a subsequent second signal representative of the generated charge, wherein the first signal and the second signal are produced with different conversion gain. The second signal may be produced non-destructively. The second signal may be produced with higher conversion gain than the first signal.

In an embodiment, an imaging device comprising is provided, the imaging device comprising: a substrate; and a pinned photodiode formed on the substrate, wherein the pinned photodiode generates charge that is representative of incident radiation, wherein the imaging device further comprises: circuitry defining a first path for measuring charge and configured to non-destructively produce a signal representative of the charge generated in the pinned photodiode, and wherein the imaging device is manufactured using CMOS techniques.

BRIEF DESCRIPTION OF FIGURES

Arrangements of the present invention will be understood and appreciated more fully from the following detailed description, made by way of example only and taken in conjunction with drawings in which.

DETAILED DESCRIPTION

Figure 1:
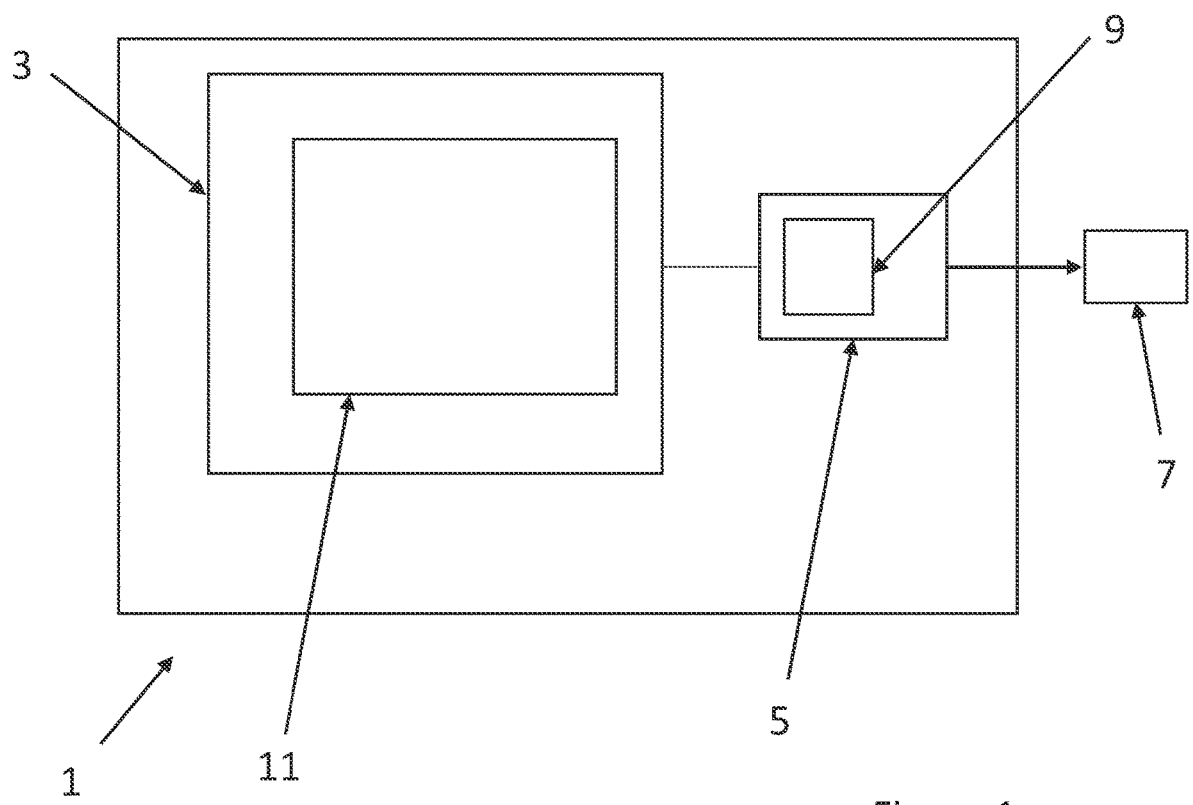
FIG. 1 shows an imaging device according to an embodiment.

FIG. 1 shows an imaging device 1 according to an embodiment. The imaging device 1 comprises a light sensing module 3 comprising a pixel array 11 having one or more pixels for sensing light incident on the imaging device.

Although we employ the term "light" here, this is by no means intended to be interpreted as meaning visible light. Indeed, imaging devices 1 and pixels according to embodiments may be employed for non-visible light imaging, such as infra-red imaging.

Pixels according to embodiments are discussed in more detail below. The pixels of the pixel array 11 may be covered with colour filters to enable the colour information of the light incident on each pixel to be recorded. The imaging device 1 further comprises an image processing module 5 comprising a processor 9 configured to process signals output from the pixel array 11 to determine the intensity of light (i.e. the number of photons) incident on each pixel of the pixel array 11.

The imaging device 1 further comprises an output 7 configured to output data relating to the intensity of the light incident on each pixel of the pixel array 11. The data may comprise an image. The imaging device 1 may be a digital imaging device and the image processing module 5 may further comprise an analogue to digital converter. In this case, the output from the imaging device 1 may comprise a digital signal.

The output 7 may be for example a direct image output, e.g. a screen or an output for an image data file that may be sent to a storage medium, networked, etc.

Figure 2:
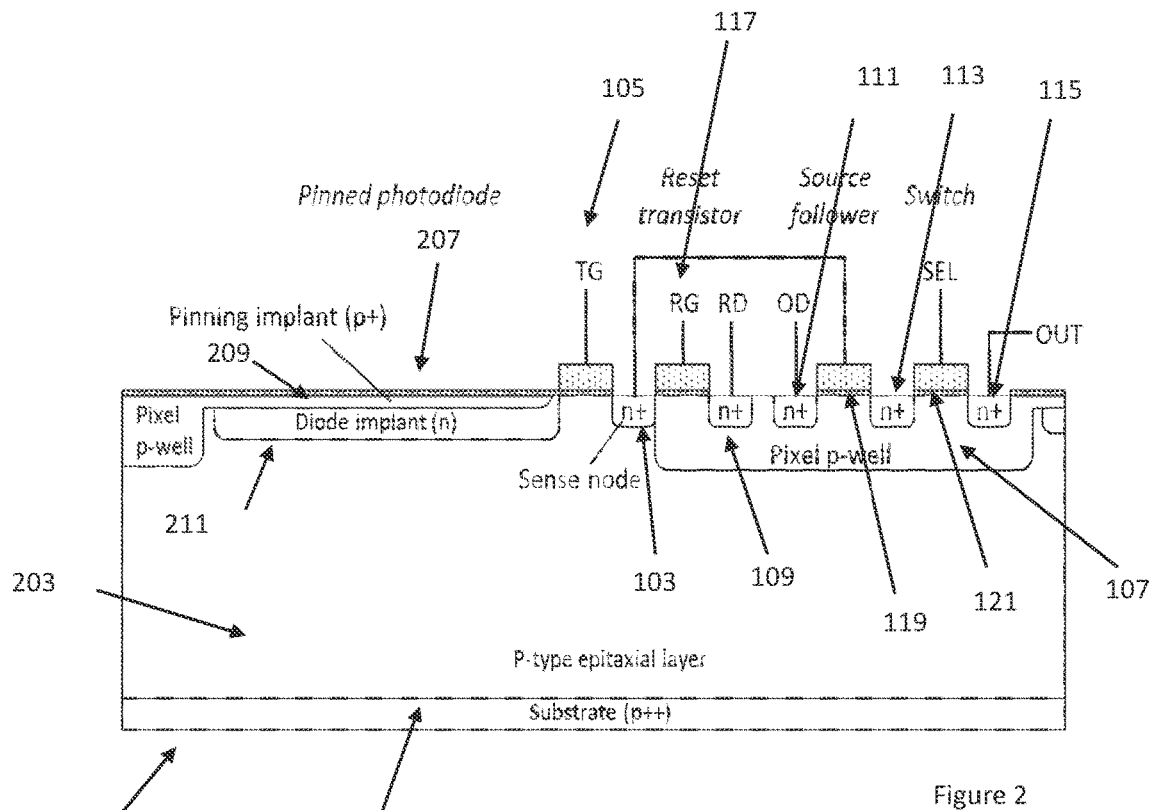
FIG. 2 shows an example of a pixel comprising a pinned photodiode.
Figure 3:
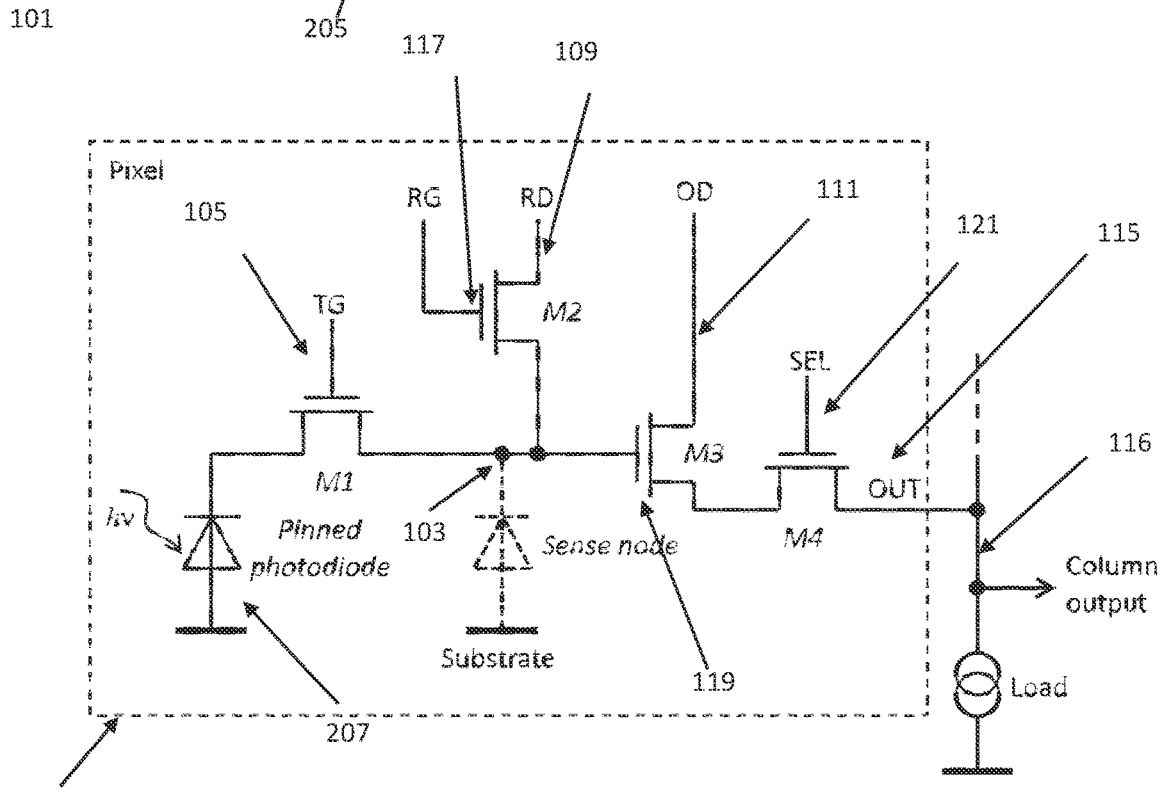
FIG. 3 shows a circuit diagram for the pixel of FIG. 3.

FIGS. 2 and 3 show an example of a Complementary Metal Oxide Semiconductor (CMOS) pixel comprising a pinned photodiode (PPD) acting as an optical element. A cross-sectional view of the pixel is given in FIG. 2. FIG. 3 shows the corresponding electronic schematic of the pixel. The same reference numerals have been employed for corresponding features in both figures.

A pinned photodiode is a photodiode comprising a layer of a first doping type implanted into an epitaxial layer of a second doping type, the layer of the first doping type itself being overlaid with a pinning layer of the second doping type. The first and second doping types are of opposing polarity.

Although specific doping polarities are described in association with examples and embodiments discussed below, the skilled person will appreciate that the doping polarities may be reversed.

Photons incident onto the surface of the PPD stimulate the generation of charge within it. A sense node comprising of a region of the first doping type is typically also embedded into the surface of the epitaxial layer. A gate electrode controls the transfer of charge from the PPD to the sense node where the charge is measured.

In the example of FIG. 2, the pixel 101 comprises a p-type epitaxial layer 203 formed on a p++ substrate 205. The pinned photodiode 207 comprises a shallow p+ pinning layer 209 implanted over an n-type diode implant layer 211 at the surface of the p-type epitaxial layer 203.

The pixel further comprises a sense node 103 comprising an n+ region near the surface of the epitaxial layer 203. A transfer gate electrode 105 located on the surface of the epitaxial layer 203 controls the transfer of charge between the pinned photodiode 207 and the sense node 103.

The pixel further comprises a p-well 107 formed at the surface of the epitaxial layer 203. Within the p-well 107 are formed four n+ regions 109, 111, 113 and 115 which together form part of the circuitry for measuring the charge on the sense node, as will become apparent from the below discussion.

A gate electrode 117 is formed on the surface of the p-well layer 107 between the sense node 103 and the n+ region 109. A drain electrode is formed on the surface of n+ region 109, thereby enabling current from the sense node 103 to the drain 109 in response to the voltage applied to the gate electrode 117 that controls the transfer of charge between the sense node 103 and the n+ region 109. Thus, the gate electrode 117 acts as a reset gate, enabling the sense node 103 to be reset, with the n+ region acting as a reset drain. This will be discussed further below.

A further gate electrode 119 is formed on the surface of p-well layer 107 between the n+ region 111 and the n+ region 113. The gate electrode 119 is electrically connected to the sense node 103, thereby acting as a source follower for sense node 103. A drain electrode is formed on the surface of the n+ region 113. Yet a further gate electrode, select electrode 121 is formed on the surface of p-well layer 107 between the n+ region 113 and the n+ region 115. An output electrode is formed on the surface of the n+ region 115, thereby enabling an output current to be output via the column output 116 to the image processor 9. The role of these components will be described in detail below.

Typically, the gate electrodes are made of polycrystalline silicon and are isolated from the monocrystalline epitaxial silicon below by a thin layer of silicon dioxide.

Various methods of manufacturing the pixel of FIG. 2 described above according to a variety of CMOS and image sensor technologies are well known in the art. In an example, a 180 nm image sensor process is employed. In this example, the epitaxial layer thickness is typically in the range between 5 μm and 18 μm, with resistivity ranging from 5 Ω·cm to 1000 Ω·cm. The pixel size of PPD image sensors can be from <1 μm to over 100 μm. The p-well is normally 1 μm deep and has doping concentration of around 1017 cm-3. The n-type PPD doping is adjusted to give pinning voltages between 0.8 V and 1.8 V, corresponding to doping concentration of around 1016 cm-3, and is between 0.5 μm and 1.5 μm deep. The p+ pinning implant is normally 0.1 μm thick and has doping concentration in excess of 1018 cm-3. The gate oxide for this technology is typically in the range between 5 nm and 10 nm.

Charge generated by light illumination is collected and stored in the PPD 207 and transferred to the sense node 103 by a pulsed voltage applied to the transfer gate (TG) 105. Immediately before the charge transfer the sense node 103 is reset by the transistor 117. The sense node 103 is buffered by the source follower 119 and its voltage sampled at the output OUT 115 when the transistor M4 is switched on. The sense node 103 voltage is sampled again immediately after the charge transfer from the PPD 207, allowing for efficient correlated double sampling (CDS) to be performed. The capacitance of the sense node 103 can be very small, resulting in very high charge-to-voltage conversion gain and low readout noise.

Figure 4:
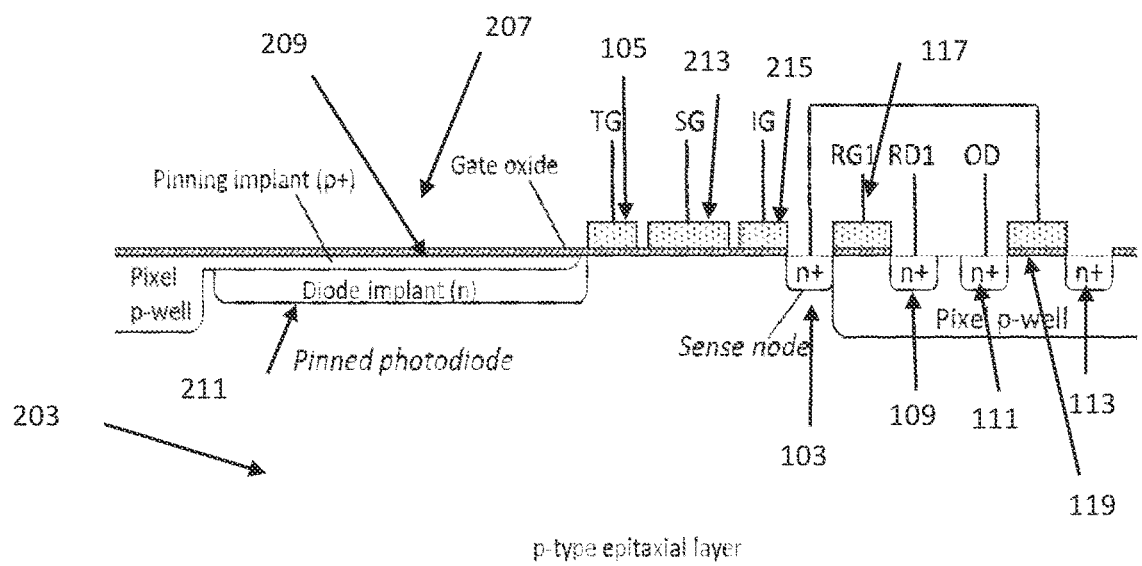
FIG. 4 shows an example of a pixel acting according to an embodiment.
Figure 5:
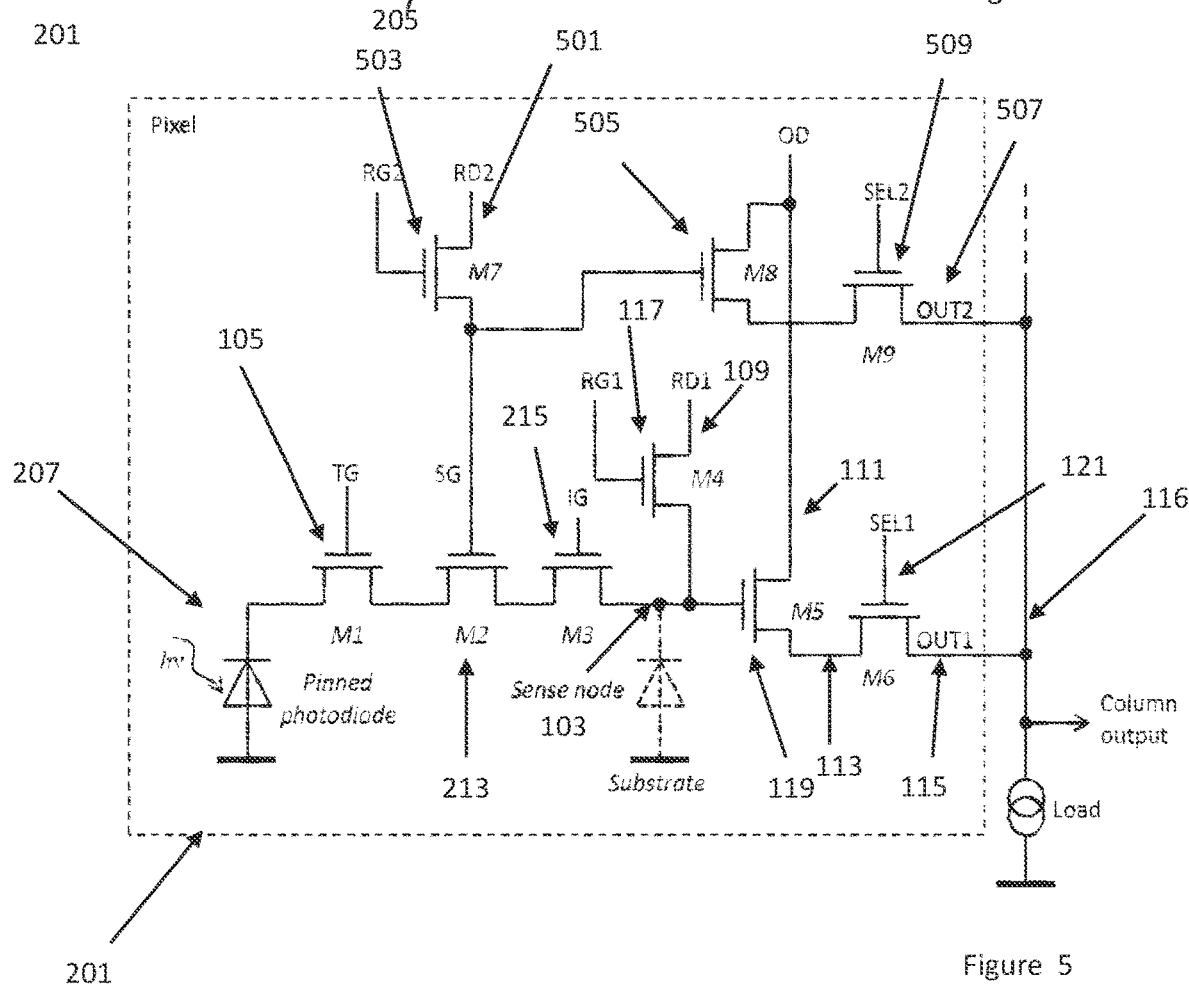
FIG. 5 shows a circuit diagram for the pixel of FIG. 4.

FIGS. 4 and 5 show a pixel 201 acting as an optical element according to an embodiment for use in the imaging device 1 of FIG. 1. A cross-sectional view of the pixel is given in FIG. 4. FIG. 5 shows the corresponding electronic schematic of the pixel. The same reference numerals have been employed for corresponding features in both figures. Similarly, features corresponding to those in FIGS. 2 and 3 are indicated with the same reference numeral as employed in those figures. Note that certain features that appear in FIG. 5 have been omitted from FIG. 4 for clarity.

In addition to the features described above in relation to FIGS. 2 and 3, pixel 201 comprises two additional gates after the transfer gate (TG) 105—a sense gate (SG) 213 and an isolation gate (IG) 215. After the charge has been collected in the PPD 207, it is then transferred via the TG 105 to the SG 213, which has been biased in advance to create a potential well under it, and is floating.

The sense gate 213 is connected to a reset transistor comprising reset drain 501 and reset gate 503. The sense gate 213 is further connected to gate 505, which acts as a source follower to buffer the potential charge on SG 213, induced by the stored charge under it. The pixel comprises a further transistor 509, configured to enable the voltage of the SG 213 to be sampled at the output OUT2 507 when the transistor 509 is switched on.

Thus, the potential change on SG 213, induced by the stored charge under it, is buffered by a source follower 505 and read out non-destructively via a separate readout path. This readout path has low conversion gain due to the capacitive charge sensing at the SG 213.

The skilled person will appreciate that other configurations of readout paths for the voltage induced in the sense gate 213 are possible.

During the non-destructive readout the isolation gate (IG) 215 is biased low to prevent the charge from escaping to the sense node 103. After charge measurement using the SG 213, the charge is then transferred to the sense node 103 by biasing IG 215 high and read out by a second source follower 119.

FIG. 5 shows the full circuit in the pixel and the two readout paths. The high conversion gain path is provided by the transistors 117, 119 and 121 and is identical to the readout circuitry shown in the pixel of FIGS. 2 and 3. The low conversion gain, non-destructive path is provided by the transistors 503, 505 and 509.

The conversion gain of the readout path provided by transistors 503, 505 and 509 is low due to the much larger capacitance of SG 213 relative to the sense node 103 capacitance, and the capacitive charge measurement using a floating gate. The low conversion gain should allow charge in excess of 100 ke– to be measured without limitations imposed by the operating voltage of the device. At the same time, the path through transistors 117, 119 and 121 can provide very high conversion gain due to the small sense node 103 capacitance, and correspondingly very low readout noise.

Note that the pixel 201 can be operated in exactly the same manner as pixel 101 described in relation to FIGS. 1 and 2 above simply by opening the isolation gate IG 215 and performing only the destructive measurement.

Figure 6:
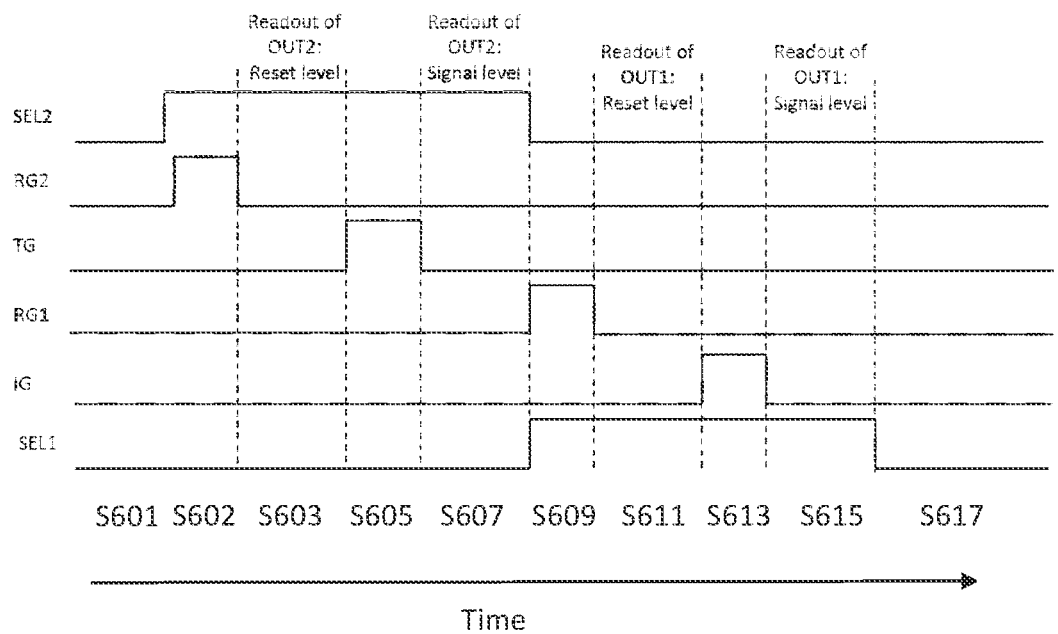
FIG. 6 shows a timing diagram for reading out the signal from the pixel shown in FIG. 4.

FIG. 6 shows a timing diagram for reading out the signal from pixel 201 according to an embodiment, with time increasing from left to right. The diagram shows the voltage applied to the transfer gate 105 (TG), the isolation gate 215 (IG), the reset gate 503 for the low gain readout circuit (RG2), the reset gate 117 for the high gain readout circuit (RG2), the select electrode 509 for the low gain circuit (SEL2) and the select electrode 121 for the high gain circuit (SEL1).

Figure 7:
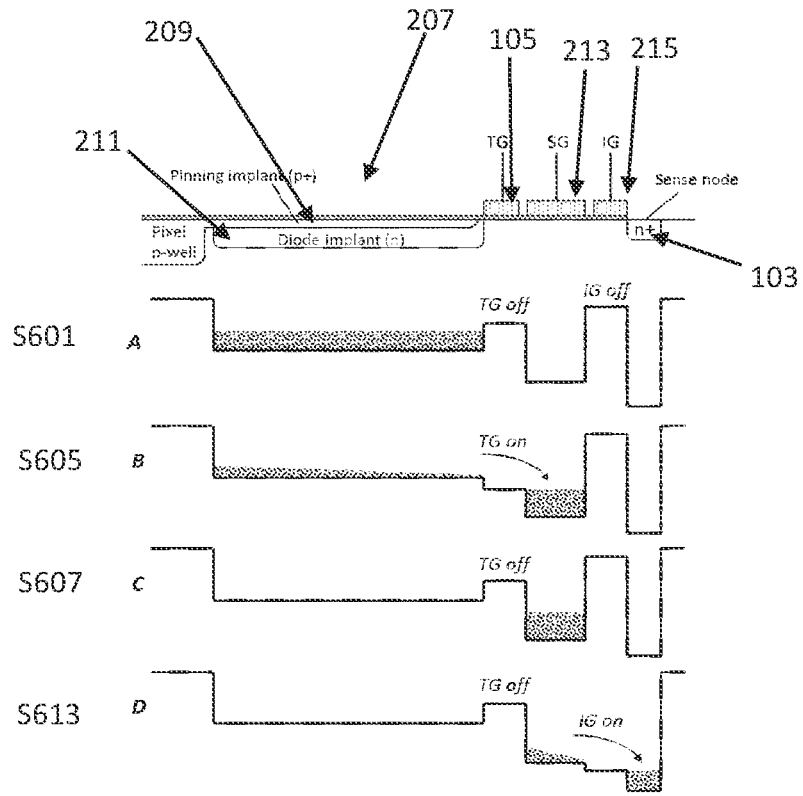
FIG. 7 shows a potential diagram for the pixel of FIG. 4 for selected steps in the readout process.

FIG. 7 shows a potential diagram for the pinned photodiode 207, the transfer gate 105 (TG), the sense gate 213 (SG), the isolation gate 215 (IG) and the sense node 103 of the pixel 201 for selected steps shown in FIG. 6. The shaded region in each potential diagram represents charge.

In step S601, photon integration on the pinned photodiode 207 takes place. During integration the TG 105 is off, corresponding to the potential diagram in FIG. 7A, and charge collects on the photodiode. As can be seen from FIG. 7A, before charge transfer from the pinned photodiode 207 takes place, the SG 213 is biased to an appropriate potential by the transistor 503 (M7) to make it more positive than the TG at the time when charge is being transferred. The voltage on the SG 213 is buffered by the source follower 505 (M8).

In step S602, a reset pulse is applied to RG2 503. SEL2 509 is also switched on to enable readout of voltage of SG 213. In step S603, the transistor M7 503 is switched off and the reset voltage level on the SG 213 is read out via M8 505 and M9 509 on the output OUT2 507.

In step S605, the charge from the PPD 207 is transferred to the SG 213 using a pulse on the TG 105 as shown in FIG. 7B.

In step S607, the TG 105 is turned off (FIG. 7C) and the voltage on the SG 213 is read out via the source follower M8 505 and the transistor M9 509 on OUT2 (the select switch 509 remains switched on, as can be seen in FIG. 6). The voltage difference on the SG 213 between the states in FIG. 7A and FIG. 7C (corresponding to steps S601 and S607) is proportional to the charge residing under the SG 213.

High signal level on OUT2 507 indicates that the high gain readout path could be saturated due to the large signal.

If this is the case the signal on OUT1 115 may simply be discarded by transferring the charge to the sense node 103, with the reset gate 503 (RG1) switched on.

In step S609, a pulse is applied to RG1 117 and select gate 121 (SEL1) is switched on. In step S611, RG1 117 is switched off and the reset signal level on the sense node 103 to be read out on OUT1 115 via the source follower M5 119 and the switch M6 121.

In step S613, the IG 215 is switched on and the charge under SG 213 is transferred to the sense node 103 as shown in FIG. 7D for detection in the same way as described above in relation to FIGS. 2 and 3.

The sampling of both reset and signal levels in the two readout paths allows correlated double sampling (CDS) to be used. This is particularly important for the signal from the high gain path at OUT1 because low readout noise is only possible when CDS is employed. CDS may not be used if the photon shot noise is much larger than the reset noise at the sense gate 213, which is a condition that could occur at high signal levels. This will simplify and speed up the readout because the reset level does not need to be sampled at time S603 if CDS is not used for the low gain path at OUT2.

To achieve high dynamic range the gain ratio between the two readout paths should be large. In an embodiment, the gain ratio between the high gain path and the low gain path is in the range 5 to 10. In another embodiment, it is in the range 2 to 20. In the embodiment described below, ratio of 10 is chosen. Both signal paths are supplied by the same drain voltage on OD and have nearly identical output voltage spans.

In this embodiment, where the gain ratio is chosen to be 10, if the signal on OUT2 is more than 10% of its saturation level the readout signal on OUT1 can be discarded because OUT1 will be in saturation. If the signal on OUT2 is below 10% of saturation only the signal on OUT1 will be used. In an embodiment, the transition point between the two signals is determined to be just below the saturation level of OUT1. At intermediate signal levels both signals may be combined in order to provide gain calibration of one signal path against the other, or the signals can be averaged.

In an embodiment, the pixel shown in FIGS. 4 and 5 forms part of an array within an imaging device according to an embodiment, as shown in FIG. 1.

Figure 8:
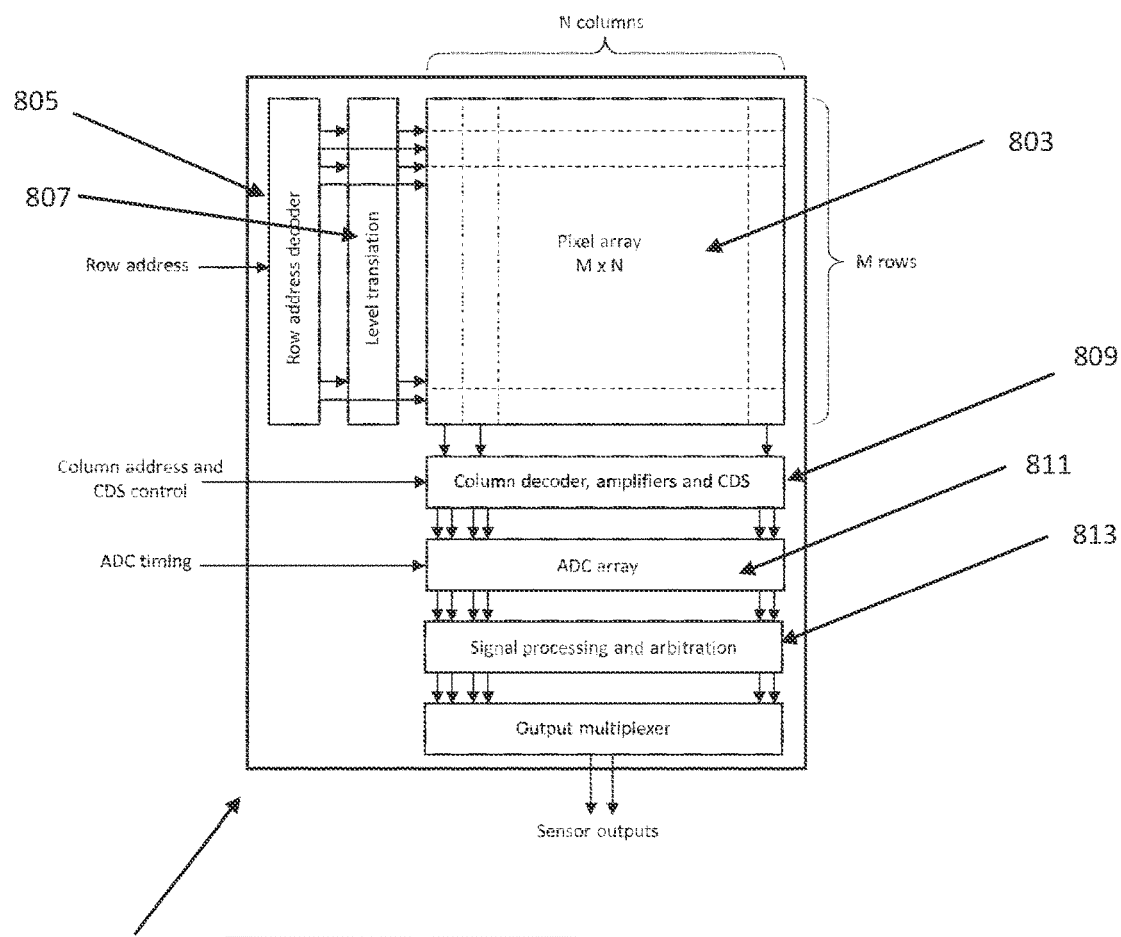
FIG. 8 shows an imaging device according to an embodiment.

FIG. 8 shows a detailed example of processing modules comprised within the imaging device 1 for processing the low and high gain signals described above according to an embodiment. Other arrangements are possible according to other embodiments.

In this embodiment, the imaging device comprises an array 803 having N columns and M rows of pixels acting as optical elements according to embodiments. The imaging device 801 further comprises a row address decoder 805 and level transition module 807. The imaging device 801 further comprises a processing module 809 that acts as a column decoder, which controls the amplifiers and which the process of correlated double sampling (CDS) described above. The imaging device 801 also has an analogue to digital converter array (ADC) 811 and a signal processing and arbitration module 813 which controls the discarding of samples when the saturation exceeds a threshold as described above. Although in the embodiment of FIG. 8, these modules are shown as residing inside the imaging device 801, in other embodiments they may reside outside of the sensor. The functioning of these modules will be now be described in detail.

In an embodiment, CMOS imaging device pixels in the array 803 are read out one row at a time. Under non-uniform illumination, typical for real-life applications, some pixels in the row may have large signals, while some may have very little. This means that both low-gain and high-gain signal paths must be read out fully, and the imaging device system has to be able to decide which signal or signals should be used via arbitration.

The imaging device 801 of FIG. 8 comprises internal logic for signal arbitration.

During row readout, both the high-gain and low-gain signals from each pixel in the row are digitised by the ADC array. In an embodiment, depending on the magnitude of the two signals, the signal processing and arbitration circuitry 813 decides which signal, or a that combination of both, will be output from each pixel. For example, if the low-gain signal is sufficiently high so that the high-gain path is in saturation, only the low-gain signal will be output and the high-gain one discarded. Conversely, when the high-gain signal is below saturation, but the low-gain signal is very low, so as not to be sufficiently above noise, only the high-gain signal will be output. In an embodiment, when both signals are in their usable range, the signal processing circuit applies a weighting algorithm consisting of scaling followed by summation and will output a weighted sum of both.

Figure 9:
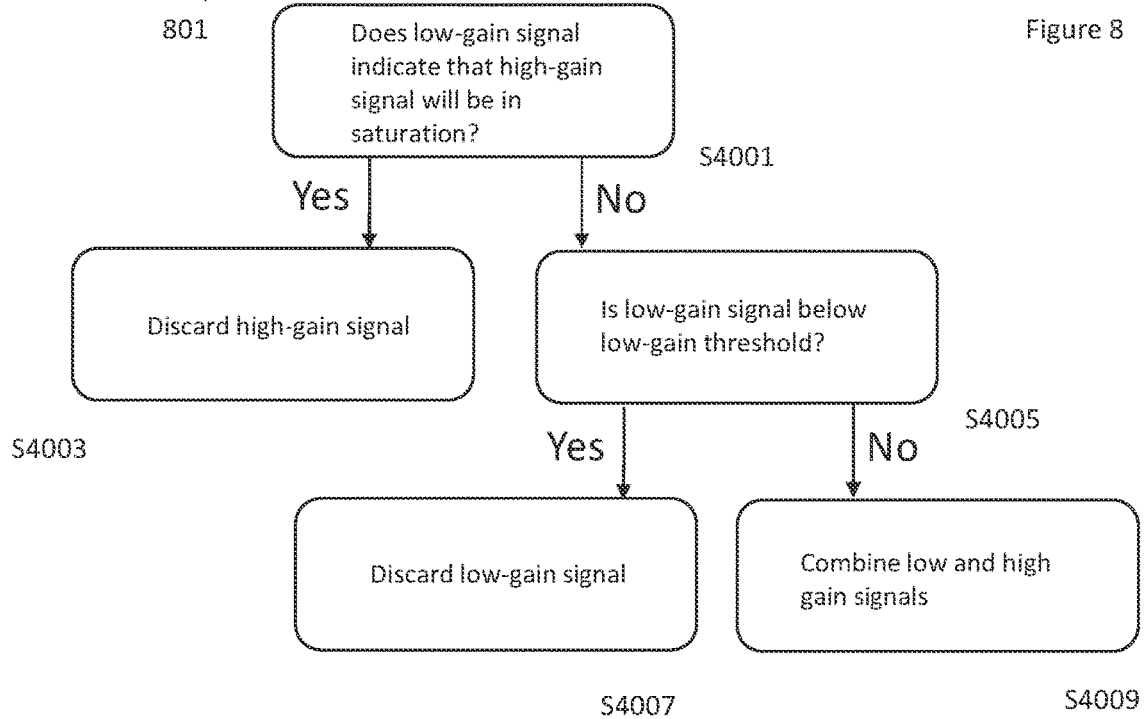
FIG. 9 shows a decision making process for signal processing according to an embodiment.

A decision chart showing the decision making process performed by the signal processing and arbitration circuitry 813 of selecting a reading according to an embodiment is shown in FIG. 9.

In step S4001, the processor compares the value of the low-gain signal with the saturation threshold, i.e. the threshold above which the high-gain signal will be in saturation. If the low-gain signal exceeds this threshold then in step S4003, the high-gain signal is discarded and only the low-gain signal is output by the imaging device 1.

If the low-gain signal does not exceed the saturation threshold, then in step S4005, the low-gain signal is compared with a low-gain threshold. If the low-gain signal is below the threshold then it is discarded in step S4007. If the low-gain signal exceeds the low-gain threshold, then in step S4009, the low and high gain signals are combined in, for example, a weighted sum.

The pixel designs according to embodiments are capable of multiple non-destructive readouts of the low-gain signal paths. In an embodiment, when used in this mode, the signal processing and arbitration circuitry may apply other algorithms. Examples of algorithms employed according to embodiments include averaging of the multiple samples, and linear interpolation.

Figure 10:
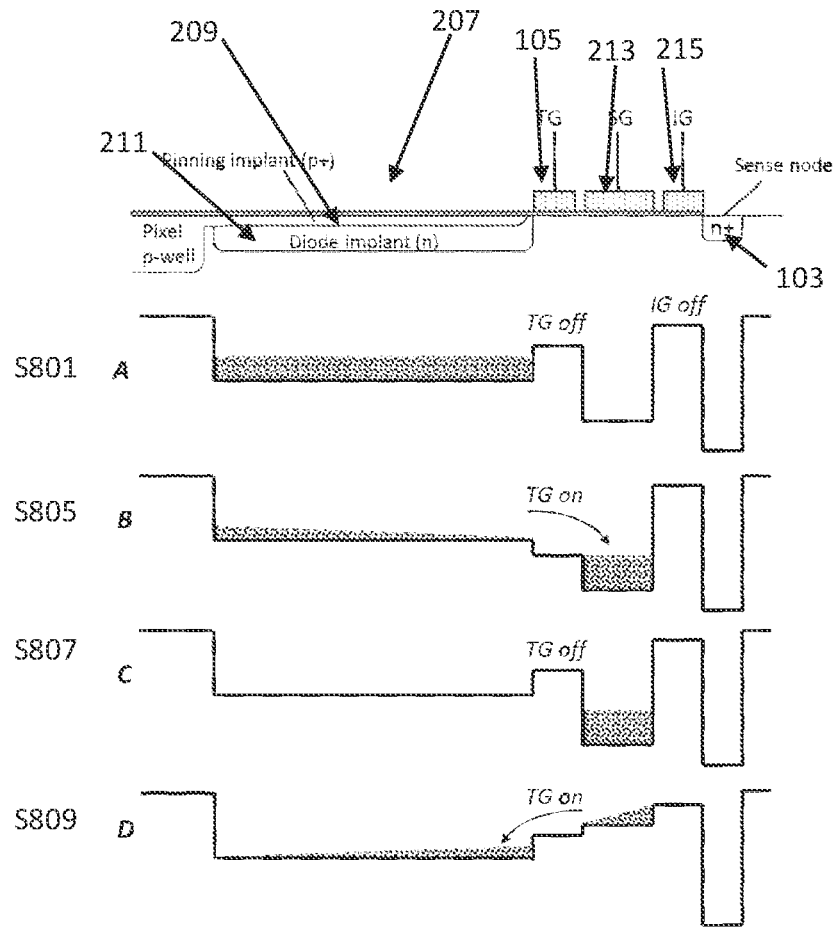
FIG. 10 shows a further potential diagram for the pixel of FIG. 4.

The pixel architecture of pixel 201 allows the charge to be transferred back to the PPD 207 after it has been sensed under SG 213, as shown in FIG. 10. Multiple forward and backward transfers between the PPD 207 and the SG 213 are possible, and the charge can be measured each time the signal is under SG 213. The charge can be transferred out from the PPD 207 and measured during signal integration, and then returned to the PPD 207 for further integration.

FIG. 10 shows a potential diagram for the operation charge transfer from the SG 213 back to the PPD 207. The steps S801, S805 and S807 are identical to steps S601, S605 and S607, as described above in relation to FIGS. 6 and 7: the charge is transferred from the PPD 207 to the SG 213 by pulsing the TG 105, followed by charge measurement at SG 213.

In step S809, the charge is then transferred back to the PPD 207 when the TG 105 is turned on, provided that the potential under the SG 213 is more negative than that under the TG 105 and the PPD 207 pinning voltage, as shown in 10D.

Figure 11:
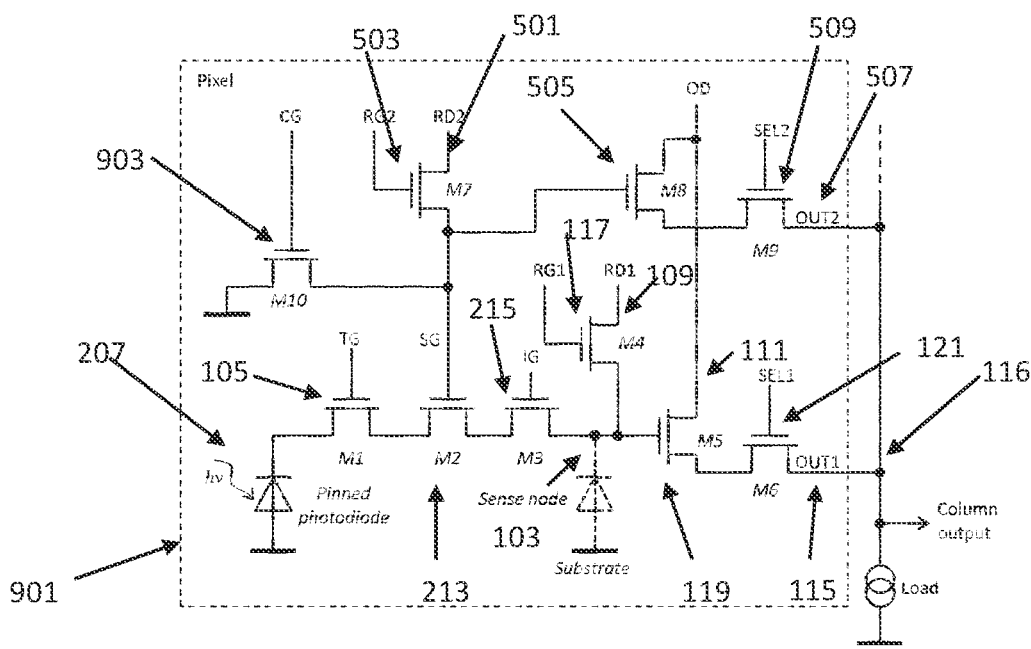
FIG. 11 shows a pixel according to an embodiment.

In an embodiment, the bias on the SG 213 can be lowered by an additional transistor. A pixel schematic of pixel 901 acting as an optical element according to this embodiment is shown in FIG. 11. Pixel 901 is identical to pixel 201, shown in FIGS. 4 and 5, with the addition of transistor M10 903 connected to the SG 213. When a voltage pulse above the transistor gate-source threshold is applied to the Clear Gate (CG) 903 the SG 213 is pulled down to substrate 205 potential, which reduces the potential under the SG 213 to facilitate charge transfer back to the PPD 207, as shown in FIG. 10D.

Figure 12:
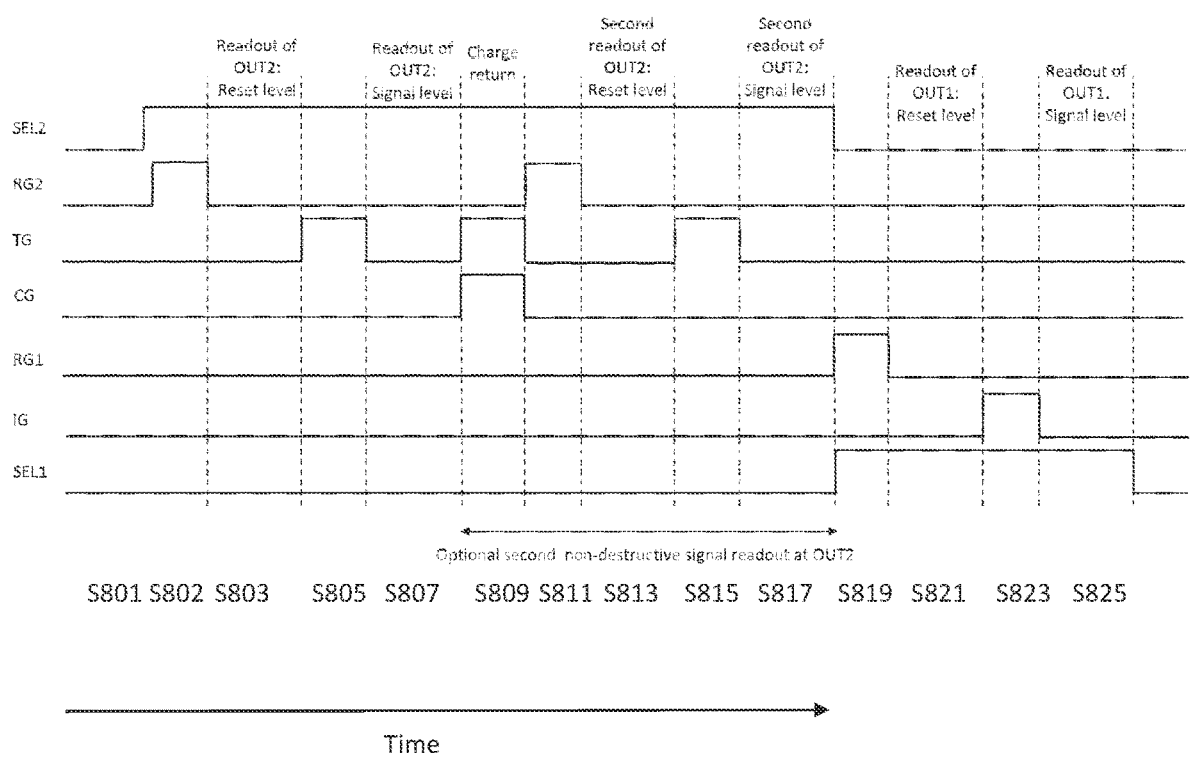
FIG. 12 is a timing diagram for the pixel of FIG. 11.

A timing diagram for the circuit according to the embodiment, and corresponding to the potential diagram of FIG. 10 is shown in FIG. 12, which uses reverse transfer to the PPD 207 and multiple sampling of the signal after each transfer.

In step S801, photon integration on the PPD 207 takes place. During integration the TG 105 is off and charge collects on the photodiode.

In step S802, a reset pulse is applied to RG2 503. SEL2 509 is also switched on to enable readout of the voltage of SG 213. In step S803, the transistor M7 503 (RG2) is switched off and the reset voltage level on the SG 213 is read out via M8 505 and M9 509 on the output OUT2 507.

In step S805, the charge from the PPD 207 is transferred to the SG 213 using a pulse on the TG 105.

In step S807, the TG 105 is turned off and the voltage on the SG 213 is read out via the source follower M8 505 and the transistor M9 509 on OUT2 (the select switch 509 remains switched on, as can be seen in FIG. 12).

In step S809, the Clear Gate (CG) 903 and the Transfer Gate (TG) 105 are switched on and charge is transferred back to the PPD 207, as shown in FIG. 8D above. Steps S811, S813 S815 and S817 then proceed exactly as S801, S802, S803, S805 and S807, thereby enabling a second non-destructive readout via the low gain circuit and OUT2.

In step S809, a pulse is applied to RG1 117 and select gate 121 (SEL1) is switched on. In step S821, RG1 117 is switched off and the reset signal level on the sense node 103 to be read out on OUT1 115 via the source follower M5 119 and the switch M6 121.

In step S823, the IG 215 is switched on and the charge under SG 213 is transferred to the sense node 103 as shown in FIG. 7D for detection in step S825 in the same way as described above in relation to FIGS. 2 and 3.

Figure 13:
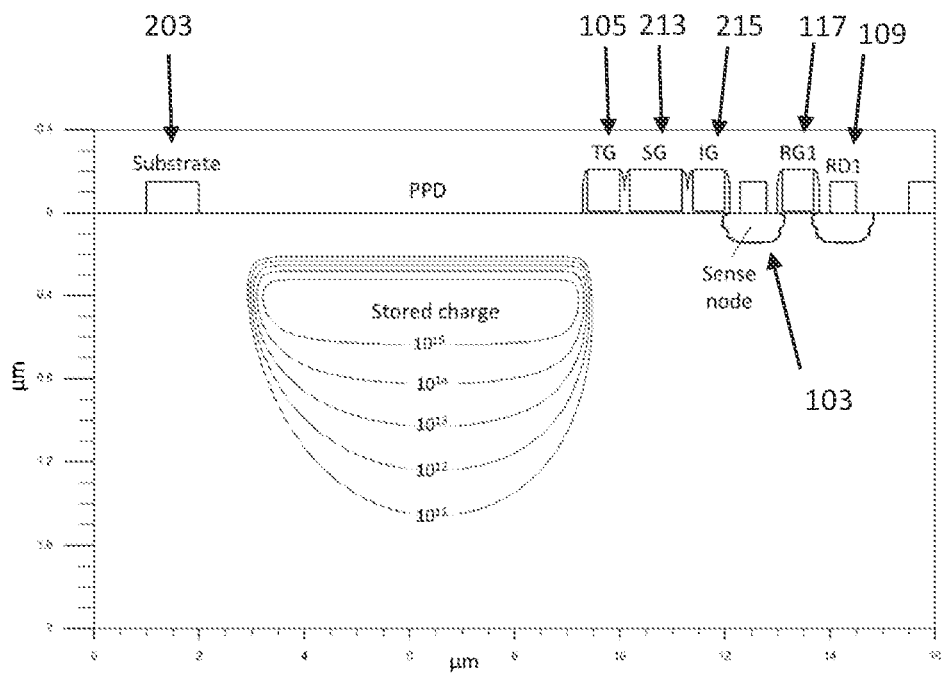
FIG. 13 shows a simulation result for electron concentration in a pixel according to an embodiment.

Semiconductor device simulations have been performed in 2-D on a PPD pixel model on 10 μm pitch. After the PPD 207 has collected charge, the electron concentration in units of cm-3, corresponding to step S601 in FIG. 7A, is shown in FIG. 13.

Figure 14:
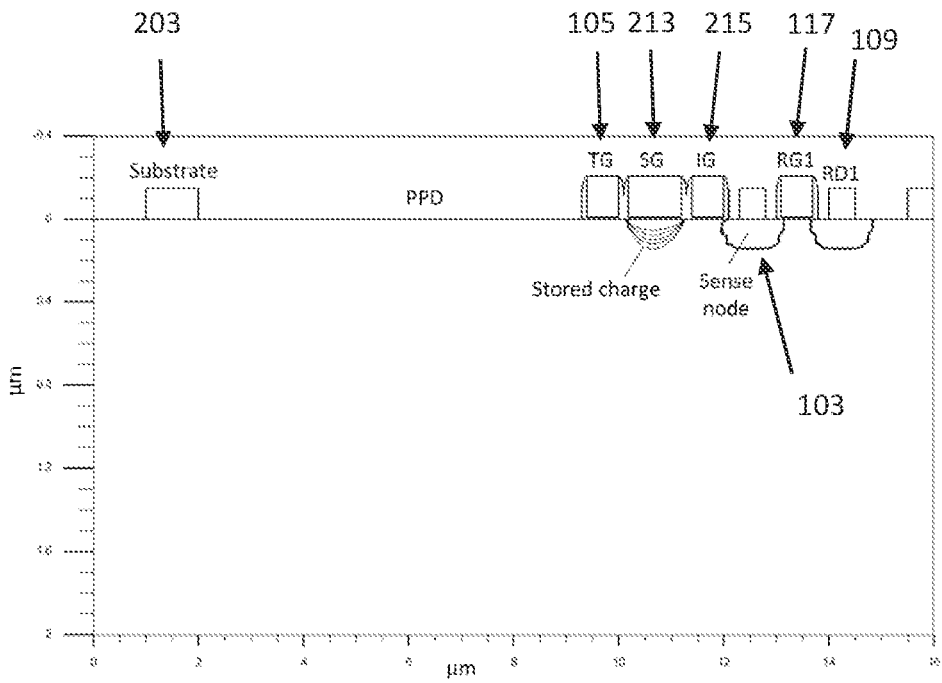
FIG. 14 shows a simulation result for electron concentration in a pixel according to an embodiment.

The electron concentration after the charge has been transferred to the SG is shown in FIG. 14, corresponding to step S607 in FIG. 7C.

Figure 15:
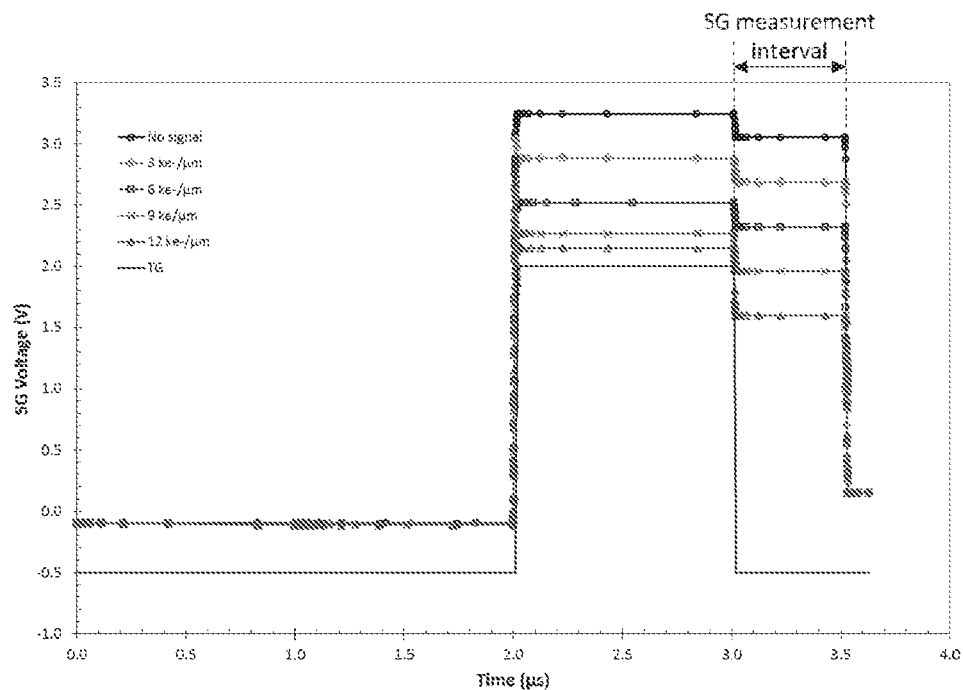
FIG. 15 shows the simulated voltage change on a sense gate of a pixel acting according to an embodiment.

The voltage change at the SG 213 for different sizes of the transferred charge is shown in FIG. 15 for a 2-D simulation model with depth of 1 μm. The voltage at the SG 213 is measured when the TG 105 voltage is low after the charge has been transferred from the PPD 207, i.e. corresponding to step S607 as described in relation to FIGS. 6 and 7 above. The simulation shows nearly linear dependence between the voltage change at the SG 213 and the number of electrons transferred from the PPD 207.

Figure 16:
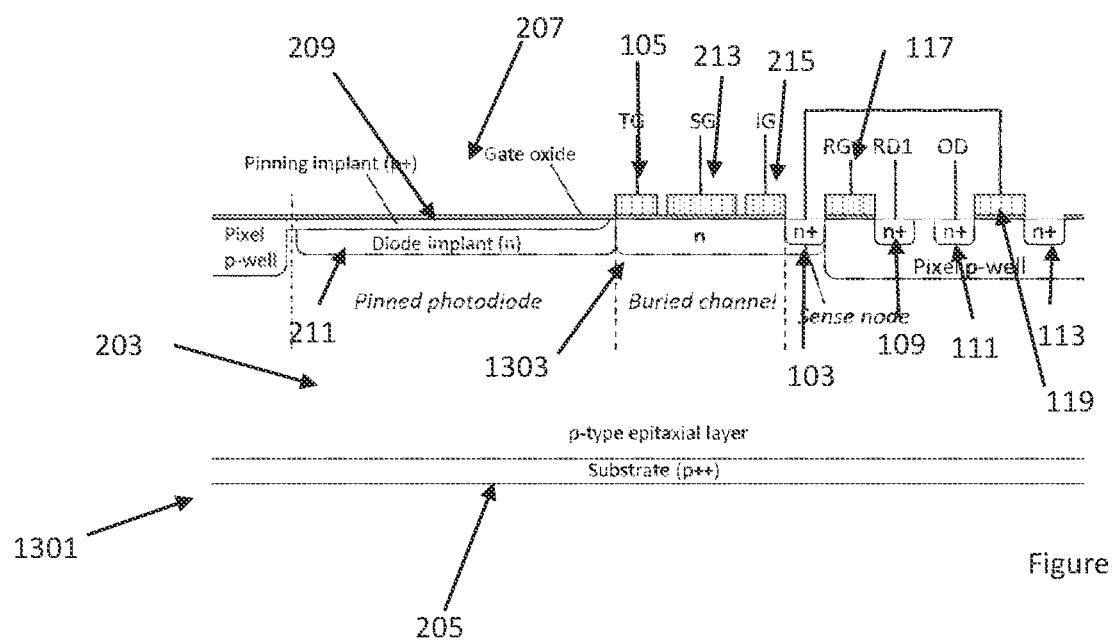
FIG. 16 shows a pixel according to an embodiment.
Figure 17:
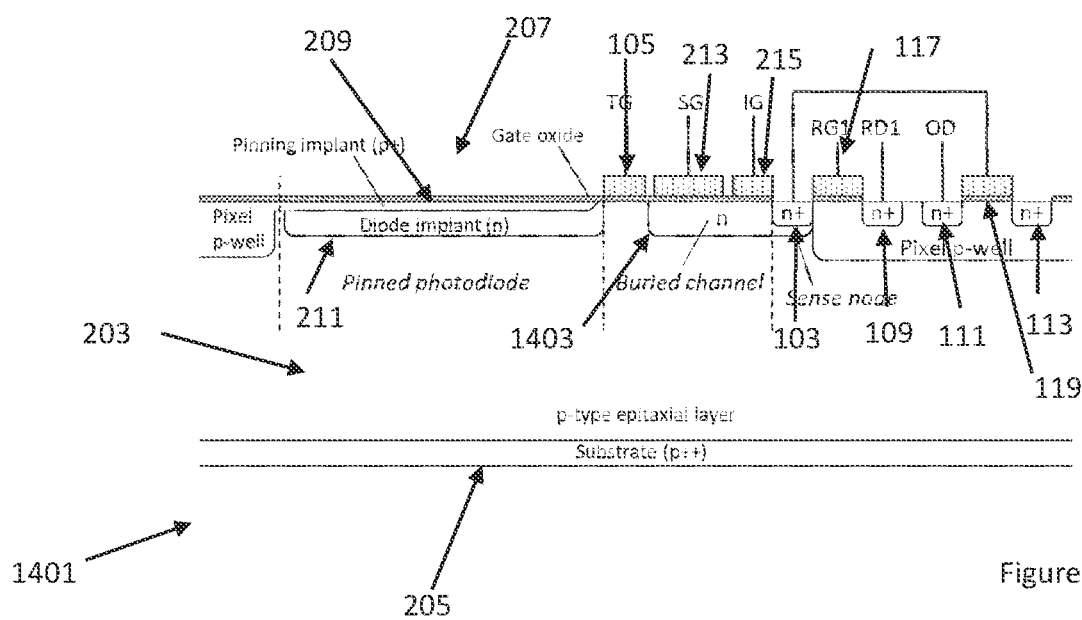
FIG. 17 shows a pixel according to an embodiment.

FIGS. 16 and 17 show cross sectional views of pixels 1301 and 1401, respectively, acting as optical elements according to embodiments.

Pixels 1301 and 1401 are identical to pixel 201 described above in relation to FIGS. 4 and 5, with the addition of buried channels 1303 and 1404, respectively, located in the epitaxial layer underneath certain gates of the pixel. A buried channel beneath a gate is formed by doping the substrate under the gate with a dopant of the opposite conductivity type than the substrate. In the embodiments of FIGS. 16 and 17, for example, an n-type dopant is employed in a p-type epitaxial layer.

In the embodiment of FIG. 16, the buried channel 1303 spans the three gates TG-SG-IG. In the embodiment of FIG. 17, the buried channel 1403, spans only SG and IG.

As shown in FIGS. 4 and 14, between the PPD 207 and the SG 213, charge is transported and stored at the silicon surface along TG-SG-IG. The buried channel arrangement ensures that charge is transported away from any surface traps present in the Si—SiO2 interface, and therefore may enable improved charge transfer efficiency from the PPD 207 to the SG 213 and the sense node 103.

Figure 18:
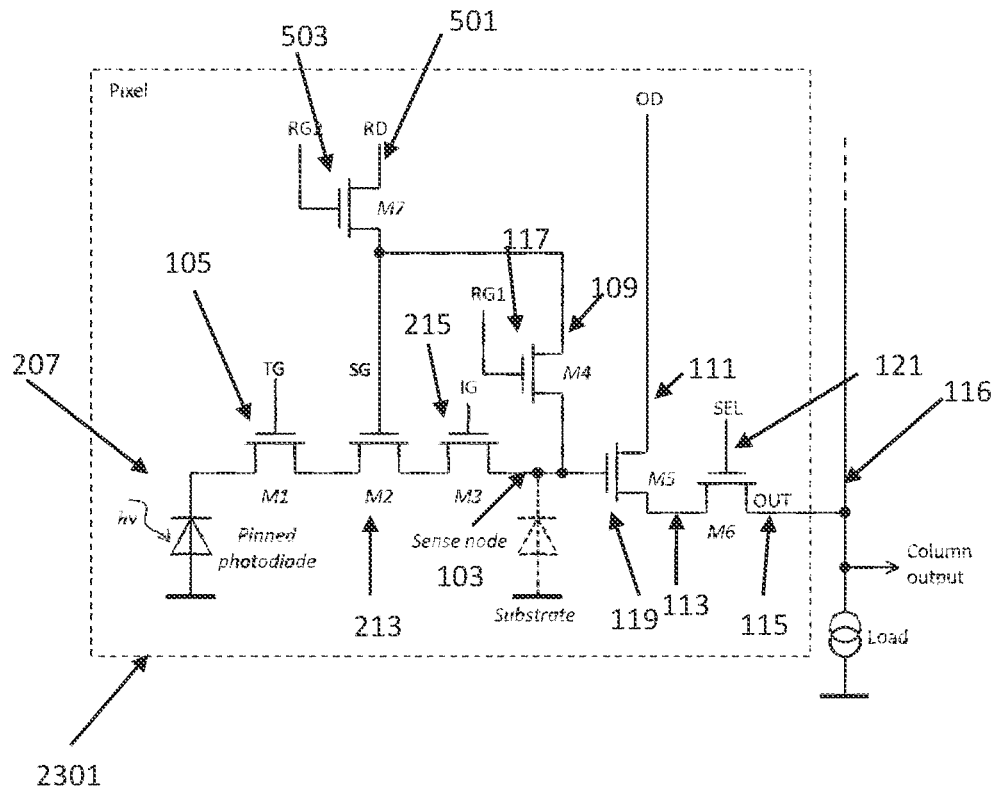
FIG. 18 shows a pixel according to an embodiment.

FIG. 18 shows a cross sectional view of a pixel 2301 acting as an optical element according to another embodiment. Pixel 2301 is identical to pixel 201 described above in relation to FIGS. 4 and 5, with the separate source follower 505 and row select transistor 509 for the low-gain signal path removed. The remaining source follower M5 119 and row select transistor M6 121 are shared for the readout of both low-gain and high-gain signal paths. The advantage of this circuit is that it simplifies the pixel design and allows larger part of the pixel to be occupied by the PPD.

In this embodiment, when reading the low-gain signal, the transistor M4 109 is used as a switch and is turned on by an appropriate voltage on its gate RG1 117. In this way, the SG 213 is connected to the gate 119 of the source follower M5 113 and its voltage is read out at the output OUT 115.

Figure 19:
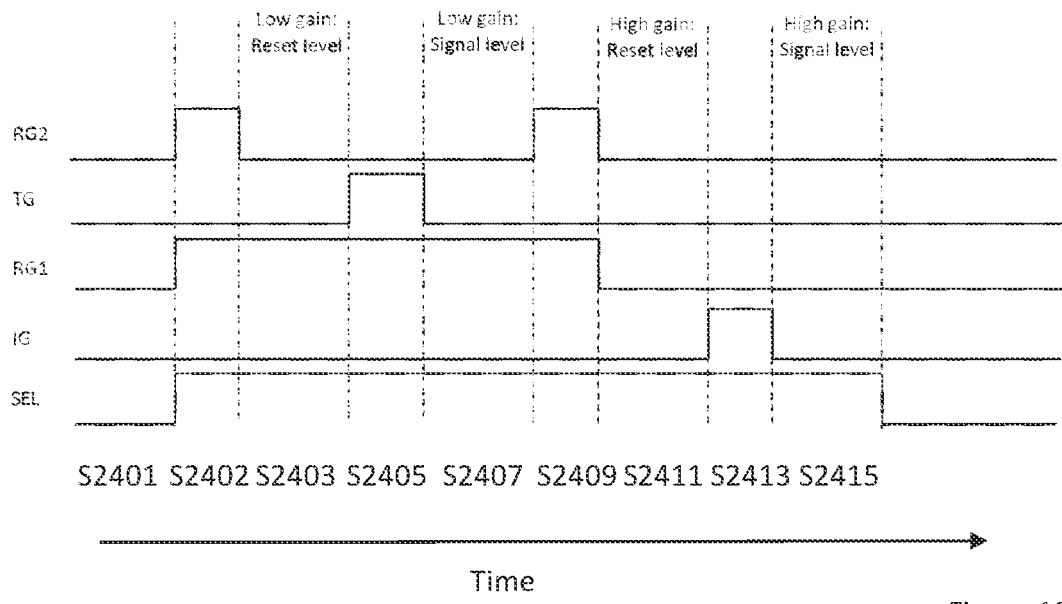
FIG. 19 shows a timing diagram for signal readout from the pixel of FIG. 18.

The timing diagram for readout with the embodiment of FIG. 18 is shown in FIG. 19.

In step S2401, photon integration on the pinned photodiode 207 takes place. During integration the TG 105 is off and charge collects on the photodiode.

In step S2402, a reset pulse is applied to RG2 503. SEL 121 and RG1 117 are also switched on to enable readout of the voltage of SG 213.

In step S2403, the transistor M7 503 is switched off and the reset voltage level on the SG 213 is read out via M5 119 and M6 121 on the output OUT 115. RG1 117 is held high to enable this process.

In step S2405, the charge from the PPD 207 is transferred to the SG 213 using a pulse on the TG 105.

In step S2407, the TG 105 is turned off and the voltage on the SG 213 is read out via the source follower M5 119 and the transistor M6 121 on OUT (the select switch 121 and reset gate RG1 117 remain switched on).

In step S2409, a pulse is applied to RG2 503 and select gate 121 (SEL) remains switched on. In step S2411, RG2 503 is switched off and the reset signal level on the sense node 103 is read out on OUT 115 via the source follower M5 119 and the switch M6 121.

In step S2413, the IG 215 is switched on and the charge under SG 213 is transferred to the sense node 103 as shown for detection in step S2415 the same way as described above in relation to FIGS. 2 and 3.

Figure 20:
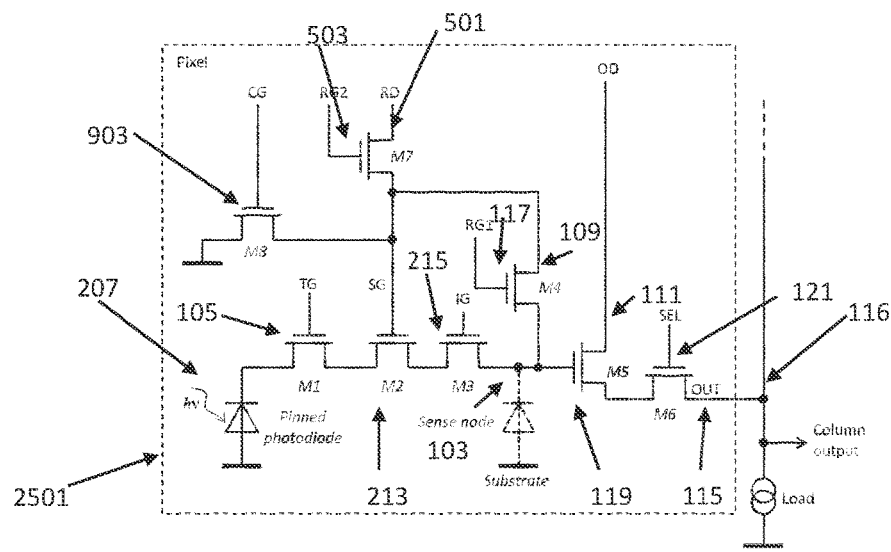
FIG. 20 shows a pixel according to an embodiment.

FIG. 20 shows the circuit diagram of a pixel 2501 acting as an optical element according to another embodiment. Pixel 2501 is identical to pixel 901 described above in relation to FIG. 11, with the separate source follower 505 and row select transistor 509 for the low-gain signal path removed, i.e. transistors M8 505 and M9 509 omitted.

Figure 21:
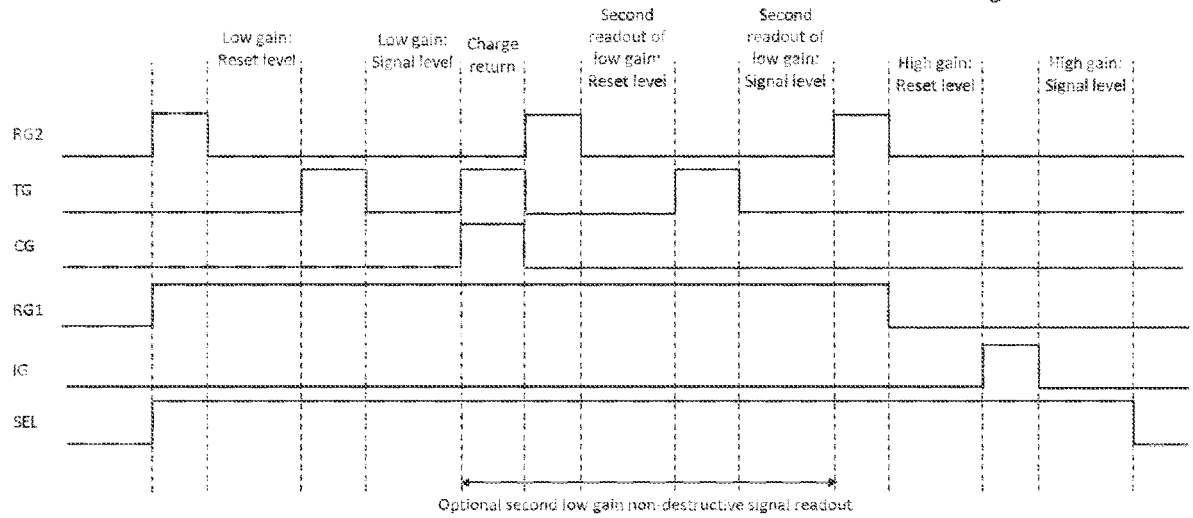
FIG. 21 shows a timing diagram for signal readout from the pixel of FIG. 20.

The timing diagram for a readout from pixel 2501 according to an embodiment is shown in FIG. 21. This timing diagram in FIG. 21 shows one readout of the low-signal path, followed by return of the charge back to the PPD 207. This happens by simultaneously turning the transfer gate (TG) 105 on to allow charge transfer, and the clear gate (CG) 903 to lower the voltage on the SG to substrate potential. Following the return of the charge to the PPD 207, the charge can be transferred back to the SG 213 and sampled again. The transfer of charge between the PPD 207 and the SG 213 can be repeated many times and can provide multiple charge measurements during signal integration.

In detail, in step S2801, photon integration on the pinned photodiode 207 takes place. During integration the TG 105 is off and charge collects on the photodiode.

In step S2802, a reset pulse is applied to RG2 503. SEL 121 and RG1 117 are also switched on to enable readout of the voltage of SG 213.

In step S2803, the transistor M7 503 is switched off and the reset voltage level on the SG 213 is read out via M5 119 and M6 121 on the output OUT 115. RG1 117 is held high to enable this process.

In step S2805, the charge from the PPD 207 is transferred to the SG 213 using a pulse on the TG 105.

In step S2807, the TG 105 is turned off and the voltage on the SG 213 is read out via the source follower M5 119 and the transistor M6 121 on OUT (the select switch 121 and reset gate RG1 117 remain switched on).

In step S2809, a pulse is applied to the clear gate CG 903 and the transfer gate TG 105, thereby enabling the charge under the SG 213 to be returned to the pinned photodiode 207. Steps S2811 to S2817 then proceed exactly as S2802 to S2807, thereby enabling a second non-destructive readout of the charge.

In Step S2819, a pulse is applied to RG2 503 and select gate 121 (SEL) and RG1 117 remain switched on. In step S2821, RG2 503 is switched off and the reset signal level on the sense node 103 is read out on OUT 115 via the source follower M5 119 and the switch M6 121.

In step S2823, the IG 215 is switched on and the charge under SG 213 is transferred to the sense node 103 as shown for detection in step S2825 the same way as described above in relation to FIGS. 2 and 3.

Figure 22:
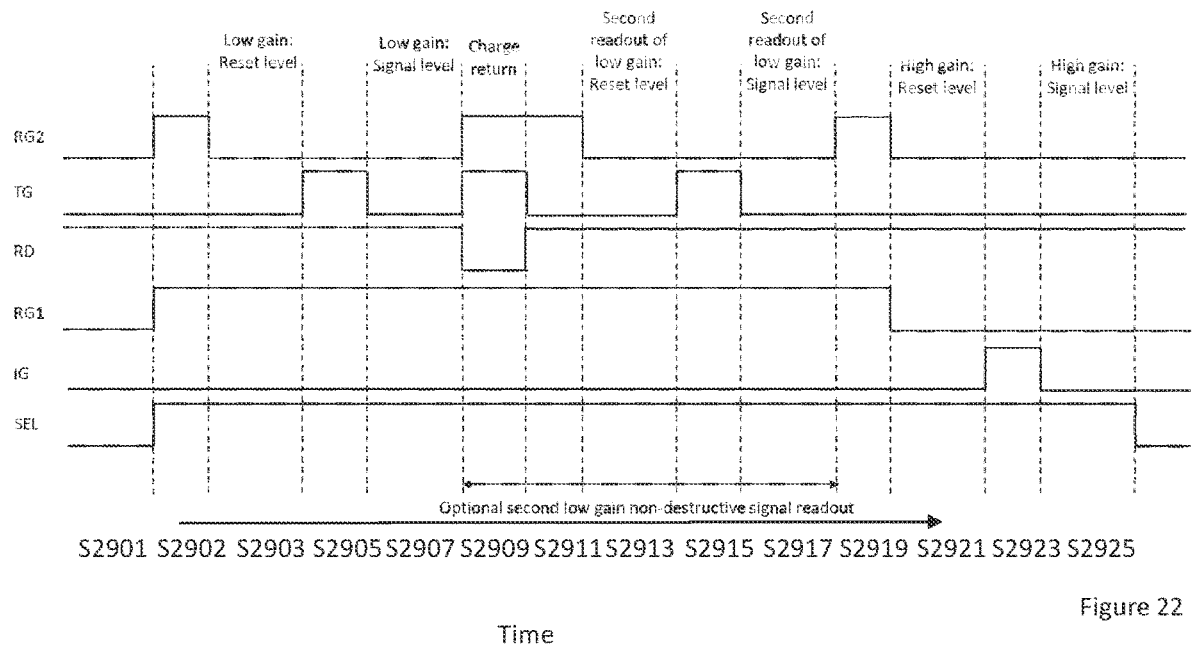
FIG. 22 shows a timing diagram for signal readout from the pixel of FIG. 18.

In an embodiment, two low-gain readouts are performed using the circuit shown in FIG. 18. In this embodiment, charge return to the PPD 207 in order to enable a second reading is achieved according to the timing diagram in FIG. 22. In this embodiment, the lowering of the potential on the SG 213 during reverse charge transfer happens by using the transistor M7 503. When M7 503 is turned on in step S2902, it connects the SG 213 to its drain RD 501, which at this moment has been externally connected to substrate for the duration of time when both the TG 105 and the RG2 503 are high in step S2909. In this way the charge can be returned to the PPD 207 for further charge collection, and then measured again multiple times. The advantage of this method of operation is that the transistor M8 in FIG. 20 is eliminated. This simplifies the pixel design and allows larger part of the pixel to be occupied by the PPD 207.

In step S2901, photon integration on the PPD 207 takes place. During integration the TG 105 is off and charge collects on the photodiode.

In step S2902, a reset pulse is applied to RG2 503. SEL 121 and RG1 117 are also switched on to enable readout of the voltage of SG 213.

In step S2903, the transistor M7 RG2 503 is switched off and the reset voltage level on the SG 213 is read out via M5 119 and M6 121 on the output OUT 115. RG1 117 is held high to enable this process.

In step S2905, the charge from the PPD 207 is transferred to the SG 213 using a pulse on the TG 105.

In step S2907, the TG 105 is turned off and the voltage on the SG 213 is read out via the source follower M5 119 and the transistor M6 121 on OUT (the select switch 121 and reset gate RG1 117 remain switched on).

In step S2909, a pulse is applied to RG2 503 and TG 105 and select gate 121 (SEL) remains switched on. At the same time, RD 501 is connected to a substrate in order to lower the potential on SG M2 213. This enables the return of charge to the PPD 207. In step S2911, RD 501 is disconnected from the substrate and TG 105 is switched off. Steps S2913 to S2917 then proceed exactly as steps S2903 to S2907 as described above enabling a second non-destructive charge readout.

In step S2919, a pulse is applied to RG2 503. In step S2921, RG2 503 is switched off and the reset signal level on the sense node 103 is read out on OUT 115 via the source follower M5 119 and the switch M6 121.

In step S2923, the IG 215 is switched on and the charge under SG 213 is transferred to the sense node 103 as shown for detection in step S2925 the same way as described above in relation to FIGS. 2 and 3.

Figure 23:
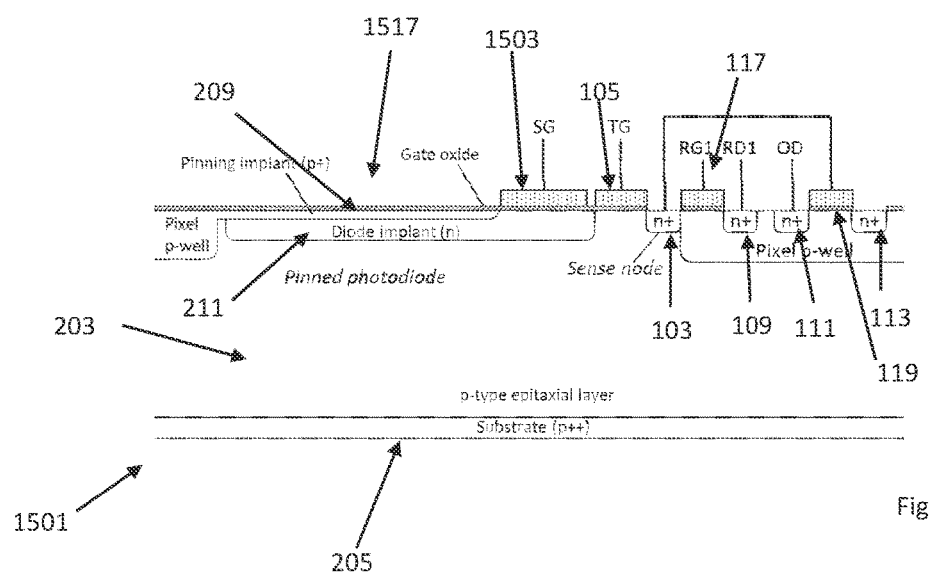
FIG. 23 shows a pixel according to an embodiment.
Figure 24:
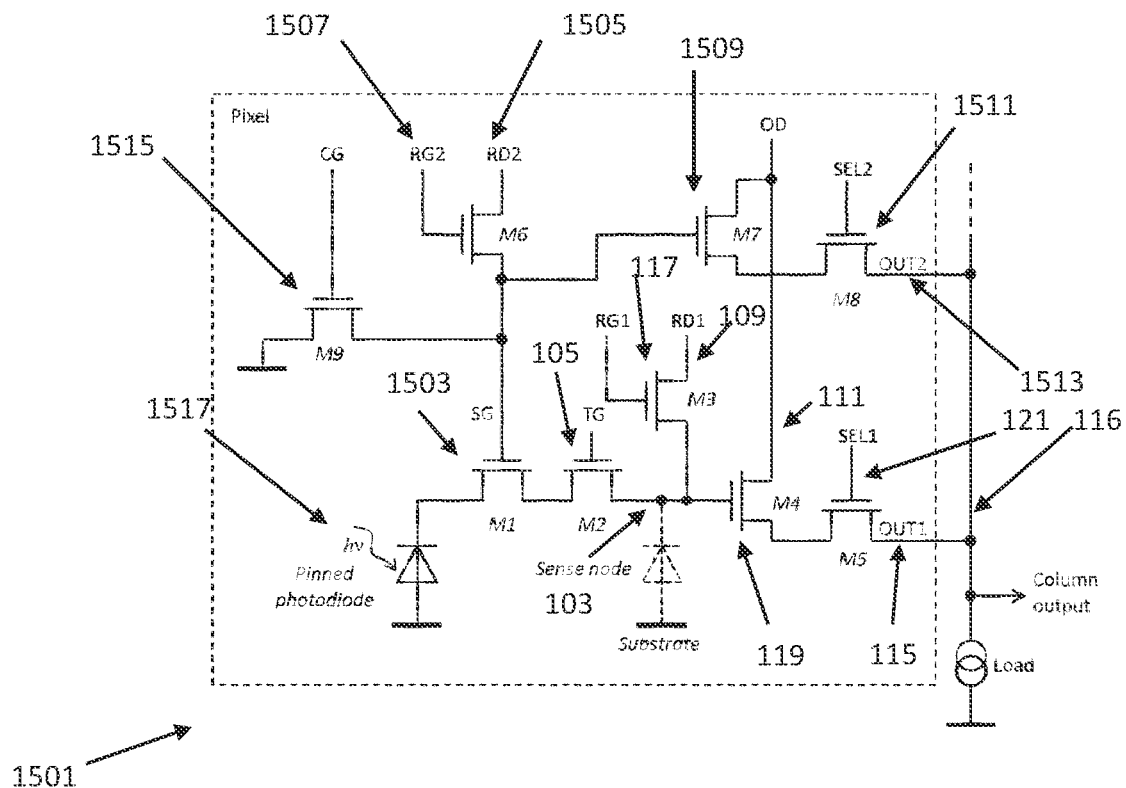
FIG. 24 shows a circuit diagram for the pixel of FIG. 23.

FIGS. 23 and 24 show cross-sectional views and pixel schematic, respectively, of pixel 1501 acting as an optical element according to an embodiment. The same reference numerals have been employed for corresponding features in both figures. Similarly, features corresponding to those in FIGS. 2 and 3 are indicated with the same reference numeral as employed in those figures. Note that certain features that appear in FIG. 24 have been omitted from FIG. 23 for clarity.

In addition to the features described above in relation to FIGS. 2 and 3, pixel 1501 comprises a floating Sense Gate (SG) 1503 positioned over a part of the PPD 1517 situated next to the TG 105. The part of the PPD over which the SG 1503 is positioned comprises only the diode implant 211; in this embodiment the pinning implant 209 does not extend under the SG 1503.

As described above in relation to the embodiment of FIGS. 4 and 5, the Sense Gate 1503 is connected to a reset transistor M6 comprising reset drain 1505 and reset gate 1507. The sense gate 1503 is further connected to gate 1509, which acts as a source follower to buffer the potential charge on SG 1503, induced by the stored charge in the PPD 1517, as will be described further below. The pixel comprises a further transistor 1511, configured to enable the voltage of the sense gate 1503 to be sampled at the output OUT2 1513 when the transistor 1511 is switched on.

The skilled person will appreciate that other configurations of readout paths for the voltage induced in the sense gate 1503 are possible.

As described above in relation to the embodiment of FIG. 11, pixel 1501 acting as an optical element according to an embodiment further comprises an additional transistor 1515 connected to the SG 1503 which enables the potential of the SG 1503 to be altered as required.

In the embodiment of FIGS. 23 and 24, due to the absence of pinning implant under the SG 1503, the potential there is higher than in the rest of the PPD 1517 even when the SG 1503 is negatively biased with respect to the substrate and the Si—SiO2 interface is inverted. The higher potential makes charge collect under the SG 1503 before it spreads over the rest of the PPD 1517 on the left of the SG 1503.

The potential on the sense gate 1503 decreases (if electrons are being collected) as charge is collected in the PPD 1517, and can be read out without interrupting the collection process. After charge collection and measurement on the sense gate 1503, the charge is transferred as usual to the sense node 103 for readout. For this, the sense gate 1503 has to be biased appropriately using transistor 1515 to prevent a potential pocket from occurring and for ensuring efficient charge transfer.

The conversion gain of the sense gate 1503 is low due to the weak capacitive coupling to the charge stored in the PPD 1517. On the other hand, the conversion gain of the sense node 103 can be much higher because its effective capacitance can be made very small, and very low readout noise can be obtained.

FIG. 24 shows the full schematic diagram of the pixel 1501. The high conversion gain path is provided by the transistors 117, 119 and 121 and is identical to the readout circuitry in described above in relation to the pixel of FIGS. 2 and 3. The low conversion gain path is provided by the transistors 1507, 1509 and 1511. The transistor 1515 is used to connect the SG 1503 to substrate during charge transfer.

Figure 25:
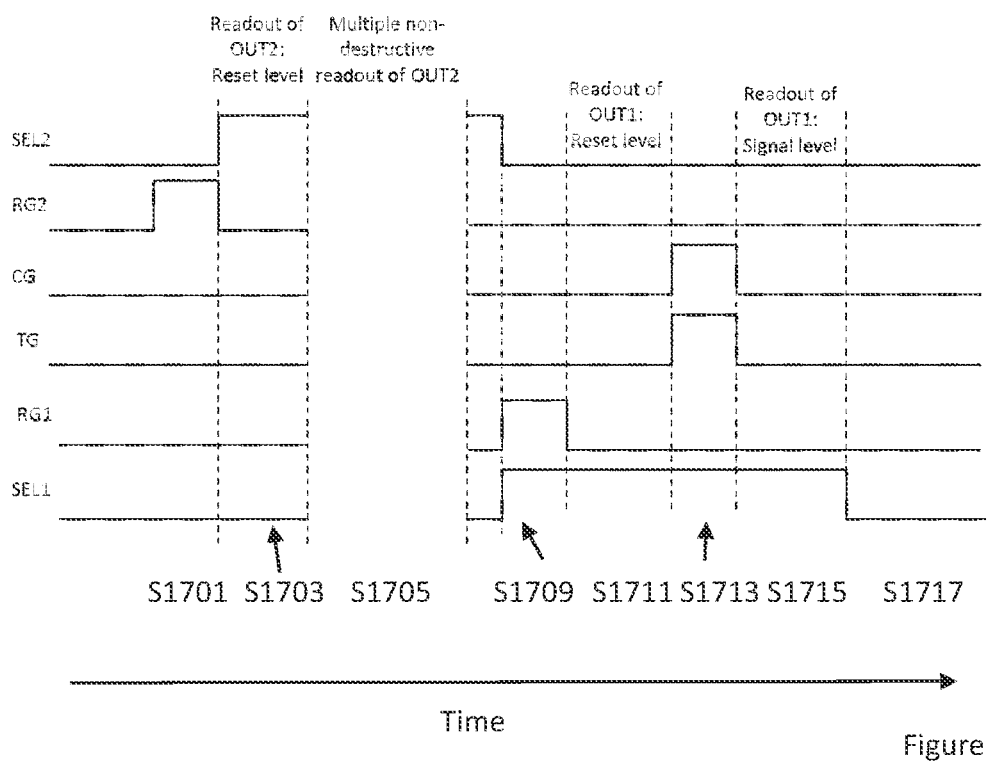
FIG. 25 shows a timing diagram for signal readout from the pixel of FIG. 23.
Figure 26:
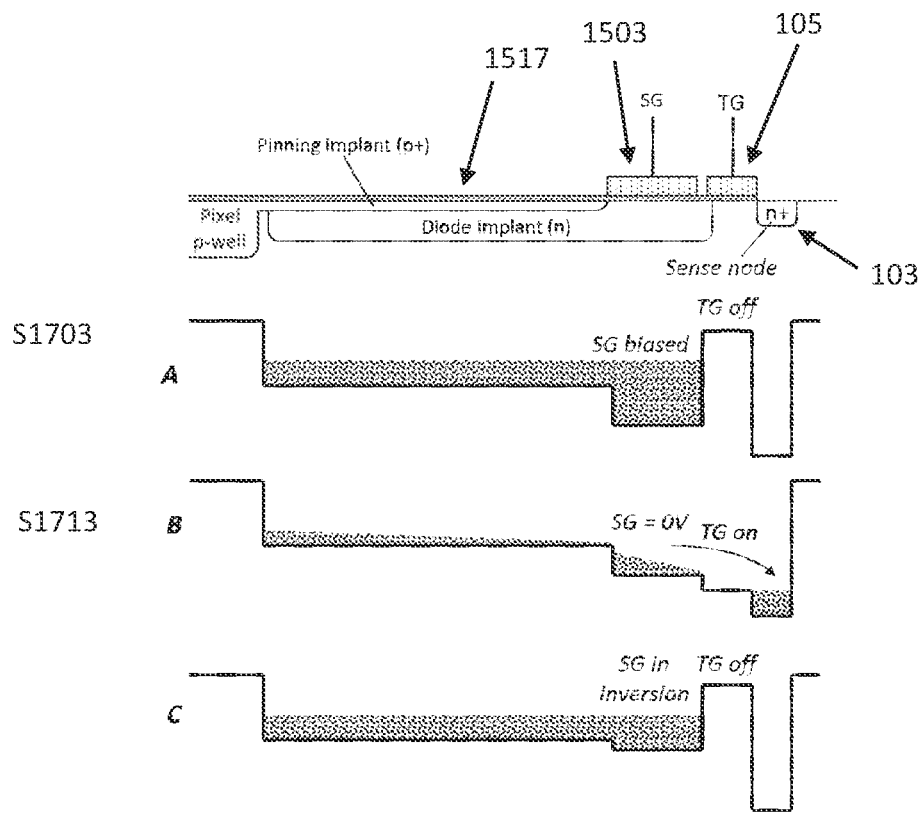
FIG. 26 shows a potential diagram for the pixel of FIG. 23 for selected steps in the readout process.

FIG. 25 shows a timing diagram for the operation according to an embodiment of pixel 1501. FIG. 26 shows a potential diagram for the pinned photodiode 1517, the transfer gate 105 (TG), and the sense gate 1503 (SG) for selected steps shown in FIG. 25. The shaded region in each potential diagram represents charge.

In step S1701, before collection commences, the SG 1503 is biased to the voltage at the reset drain RD2 1505 by switching the transistor M6 on by a pulse at its gate RG2 1507. As a result, the potential under SG 1505 becomes significantly higher than the PPD pinning potential. This ensures that charge collects under the SG 1505 during charge collection in step S1703. As more charge is collected it overflows and fills up the rest of the PPD 1517, as shown in the potential diagram in FIG. 26A.

During charge collection during steps S1703 and S1705, the potential on SG 1503 can be sampled multiple times on the output OUT2 1513, provided that the transistor 1511 1511 is on and 121 is off. This does not interfere with the collection process because the potential on the SG 1503 is not disturbed. The reset voltage level on the SG 1503 is sampled immediately after the RG2 1507 pulse to allow correlated double sampling to be used.

In step S1709, after charge collection, 1511 (SEL2) is switched off and the sense node 103 is reset by a pulse on the transistor 117. 121 (SEL1) is also switched on. In step S1711, after a pulse on the 117 transistor, the reset voltage level is sampled on the output OUT1 115 as in the readout scheme described in relation to FIGS. 2 and 3.

In step S1713, the charge in the PPD 1517 is transferred to the sense node 103 when the TG 105 is biased high and the transistor 1515 is turned on by a pulse on the clear gate (CG). This corresponds to the potential diagram in FIG. 26B. In step S1715, after charge transfer the signal level is sampled on the output OUT1 115, due to SEL1 121 being biased high.

In the embodiment of FIGS. 23 and 24, the part of the PPD 1571 under the SG 1503 is not pinned and is expected to have much higher dark current that the rest of the PPD 1571. To mitigate that, the SG 1503 can be brought down to negative voltage with respect to substrate, which will invert the Si—SiO2 interface and saturate it with holes as shown in FIG. 26C. Once taken out of inversion, the electron-hole generation at the Si—SiO2 interface remains suppressed for considerable time, ranging from milliseconds to seconds and strongly dependant on the temperature, which results in a reduction of the dark current.

Figure 27:
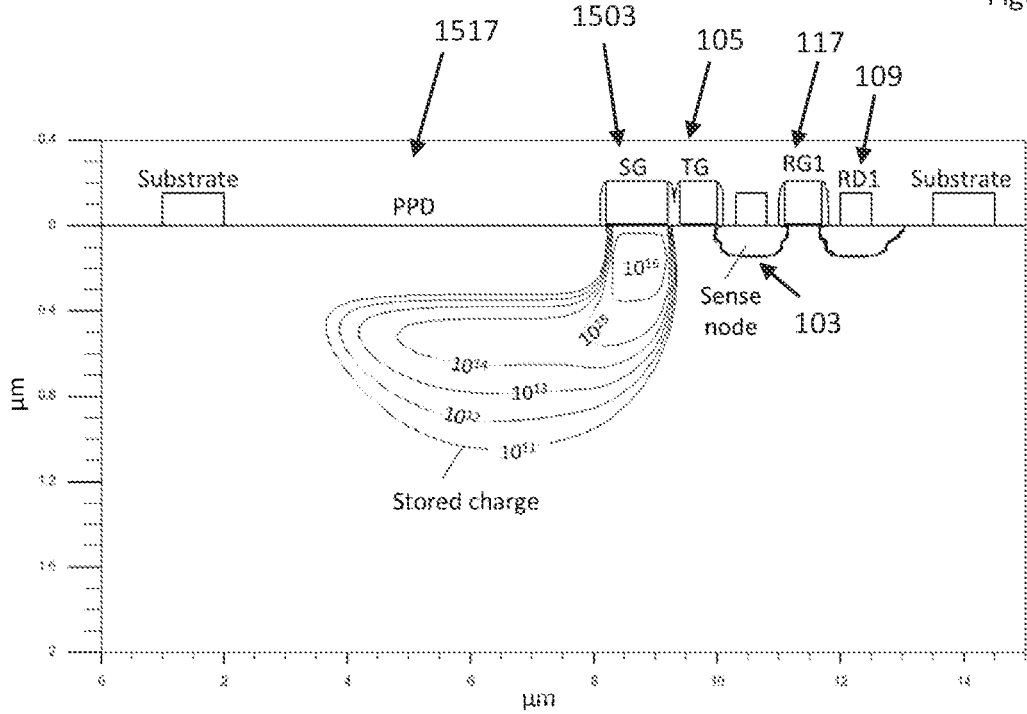
FIG. 27 shows a TCAD simulation of the operation during charge collection of the pixel of FIG. 23.
Figure 28:
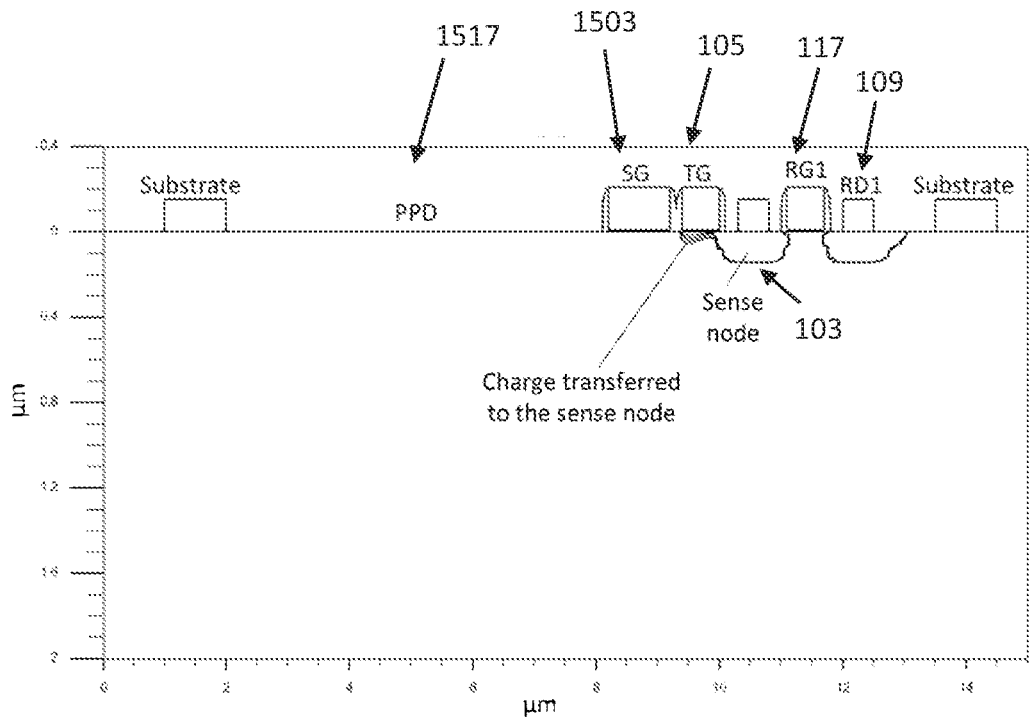
FIG. 28 shows a TCAD simulation of the operation following charge transfer to the sense node in the pixel of FIG. 23.

FIG. 27 shows a TCAD simulation of the pixel operation during charge collection corresponding to Step S1703 shown in FIG. 26A, with the contours depicting the electron density in units of cm-3. FIG. 28 shows the electron density at time corresponding to Step S1713 shown FIG. 26B, when most of the charge has been transferred to the sense node 103.

Figure 29:
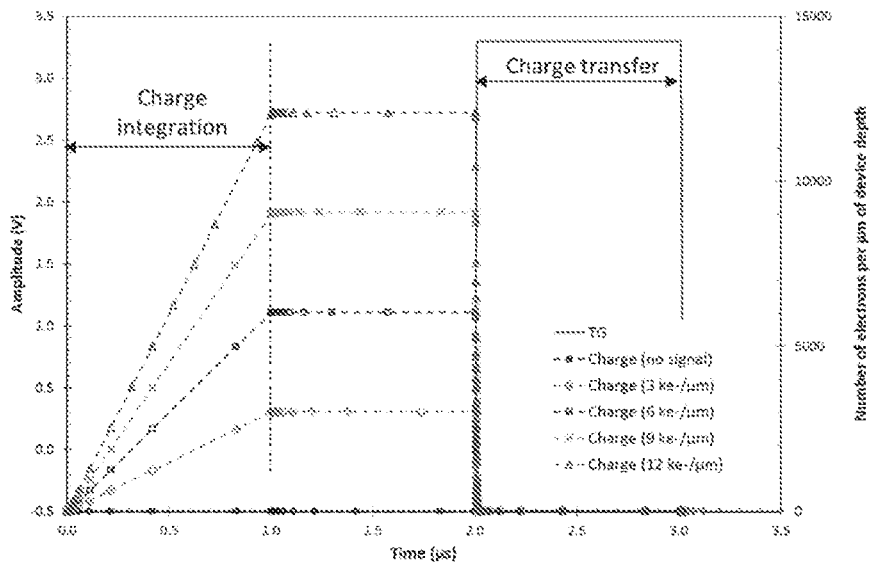
FIG. 29 shows a simulation result for electron concentration in a pixel according to an embodiment.

FIG. 29 shows the simulated charge in the PPD 1517 versus time at different light levels. The number of electrons in the PPD 1517, plotted on the right hand side scale, increases linearly with time during the 1 µs-long illumination. At the same time, the voltage on the SG 1503 in FIG. 30 decreases linearly, and the voltage change at the end of the charge integration is proportional to the amount of charge stored in the PPD 1517. Multiple measurements of the SG 1503 voltage are possible during charge collection.

Figure 30:
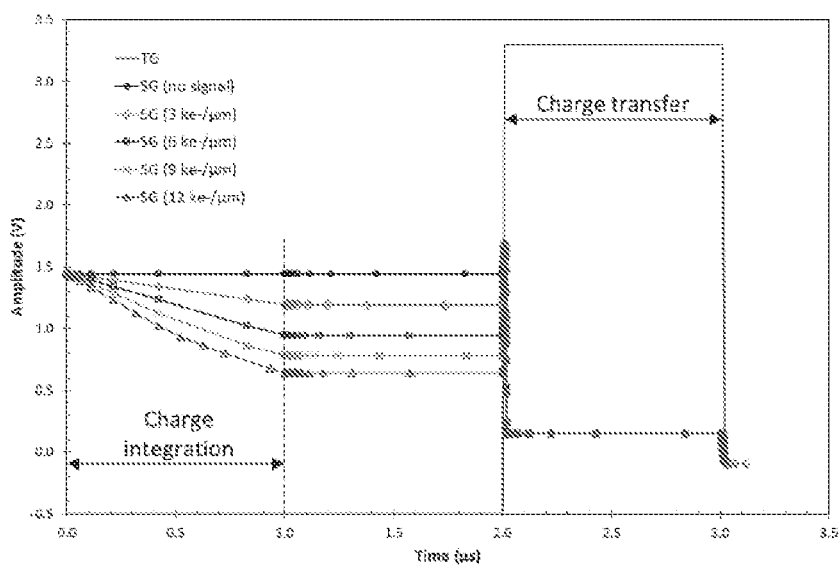
FIG. 30 shows a simulation result for voltage on the sense gate of a pixel acting according to an embodiment.

After integration and measurement at the SG 1503, the charge is transferred to the sense node 103 by pulsing the TG 105 high as shown in FIG. 30 (TG plotted on the left hand side scale).

Similarly to the readout timing described in FIG. 6, the signal on OUT2 is used when the signal on OUT1 has reached saturation. The gain ratio between the two readout paths should be sufficiently large to achieve high dynamic range. In an embodiment a gain ratio of 10 is employed.

Since charge transfer is not required for signal measurement on OUT2, multiple measurements during integration can be obtained and used to refine the measured value of the output signal. For example, during constant illumination the signal at the SG 1503 decreases linearly with time (if electrons are being collected) and this can be used to linearly extrapolate the signal towards longer integration times. This can be useful when the sensor 1 operates at high frame rates in order to provide a better estimate of the signal. Also, when long integration times are not possible due to signal saturation or very high illumination levels, linear interpolation can be used to further increase the dynamic range of the sensor.

Figure 31:
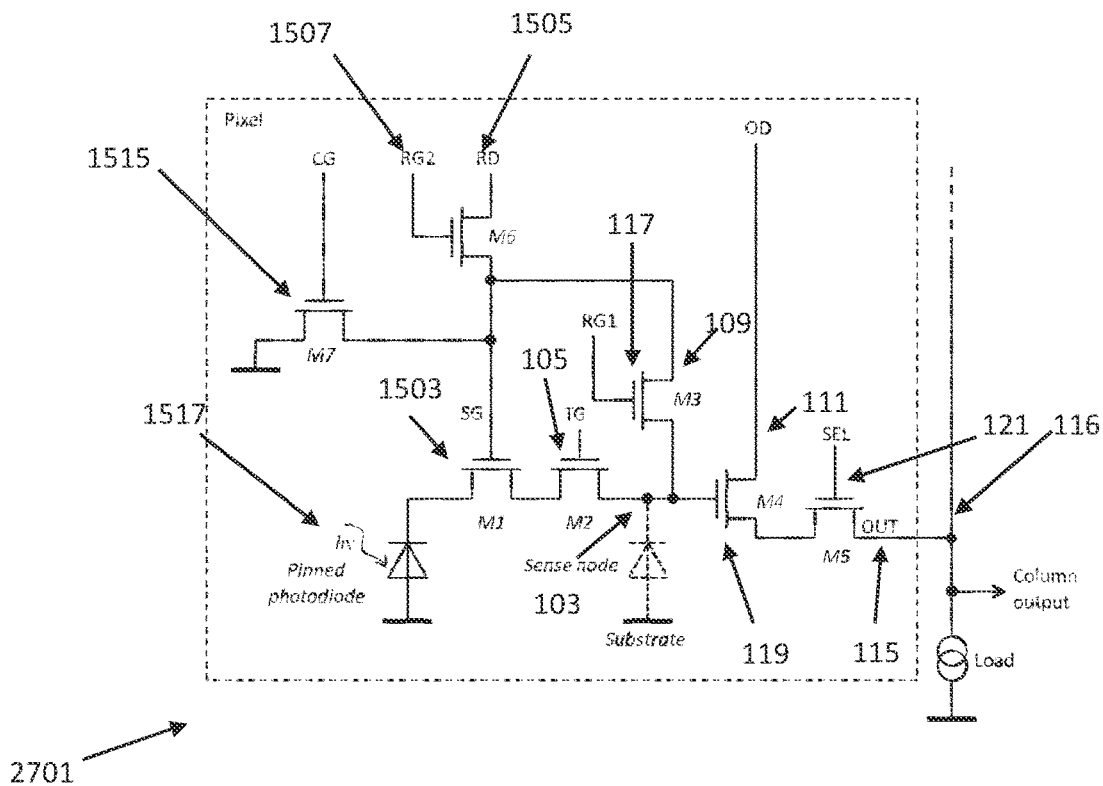
FIG. 31 shows the circuit diagram of a pixel according to an embodiment.

FIG. 31 shows a circuit diagram of a pixel 2701 acting as an optical element according to another embodiment. Pixel 2701 is identical to pixel 1501 described above in relation to FIGS. 23 and 24 with the separate source follower 1509 and row select transistor 1511 for the low-gain signal path removed. The remaining source follower M4 119 and row select transistor M5 121 are shared for the readout of both low-gain and high-gain signal paths.

Figure 32:
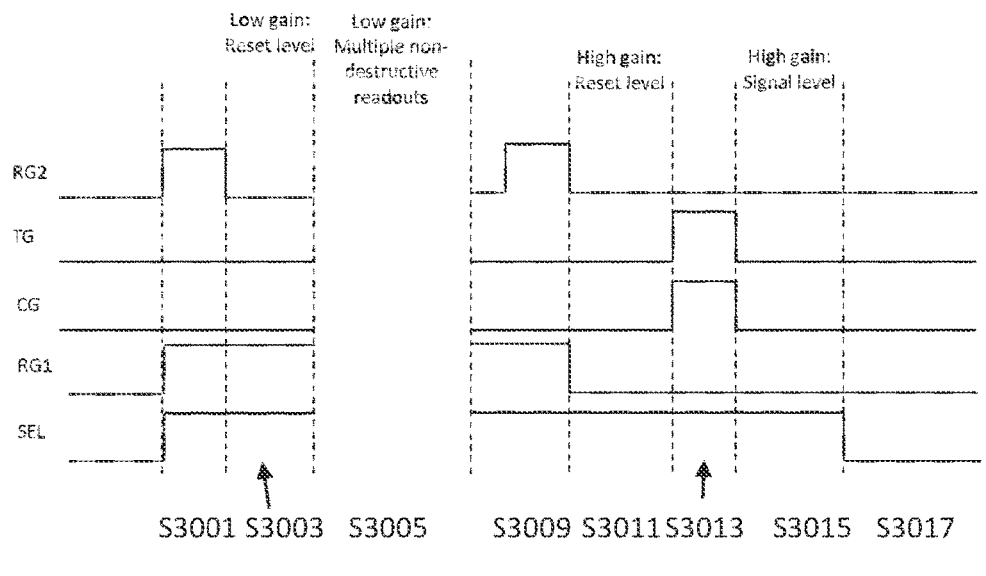
FIG. 32 shows the timing diagram for the pixel of FIG. 31.

The timing diagram for the circuit in FIG. 31 is shown in FIG. 32 according to an embodiment. During the readout of the low-gain signal path the transistor M3 is turned on and connects the sense gate SG 1503 to the gate of the source follower M4. During the readout of the high-gain signal path the transistor M3 is turned off after reset of the sense node. This is followed by charge transfer to the sense node 103, accomplished by lowering the potential on the sense gate SG 1503 by turning the transistor M7 on, while simultaneously pulsing the transfer gate TG 105 high. The steps will now be described in detail.

In step S3001, before collection commences, the SG 1503 is biased to the voltage at the reset drain RD2 1505 by switching the transistor M6 on by a pulse at its gate RG2 1507. As a result, the potential under SG 1503 becomes significantly higher than the PPD 1517 pinning potential. This ensures that charge collects under the SG 1503 during charge collection in step S3005. RG1 117 and SEL 121 are also switched on to enable readout at OUT 115. In Step S3003, RG2 is switched off and the reset level is read out.

During charge collection during steps S3005, the potential on SG 1503 can be sampled multiple times on the output OUT 1513, provided that the RG1 117 and SEL 121 are on. This does not interfere with the collection process because the potential on the SG 1503 is not disturbed. The reset voltage level on the SG 1503 is sampled immediately after the RG2 1507 pulse to allow correlated double sampling to be used.

In step S3009, after charge collection, the sense node 103 is reset by a pulse on the transistor RG2 1507 while RG1 117 and SEL 121 remain switched on. In step S3011, after the pulse on RG2 1507, the reset voltage level is sampled on the output OUT 115 by switching off RG1 117.

In step S3013, the charge in the PPD 1517 is transferred to the sense node 103 when the TG 105 is biased high and the transistor 1515 is turned on by a pulse on the clear gate (CG) 903. In step S3015, after charge transfer the signal level is sampled on the output OUT 115, due to SEL 121 being biased high.

Figure 33:
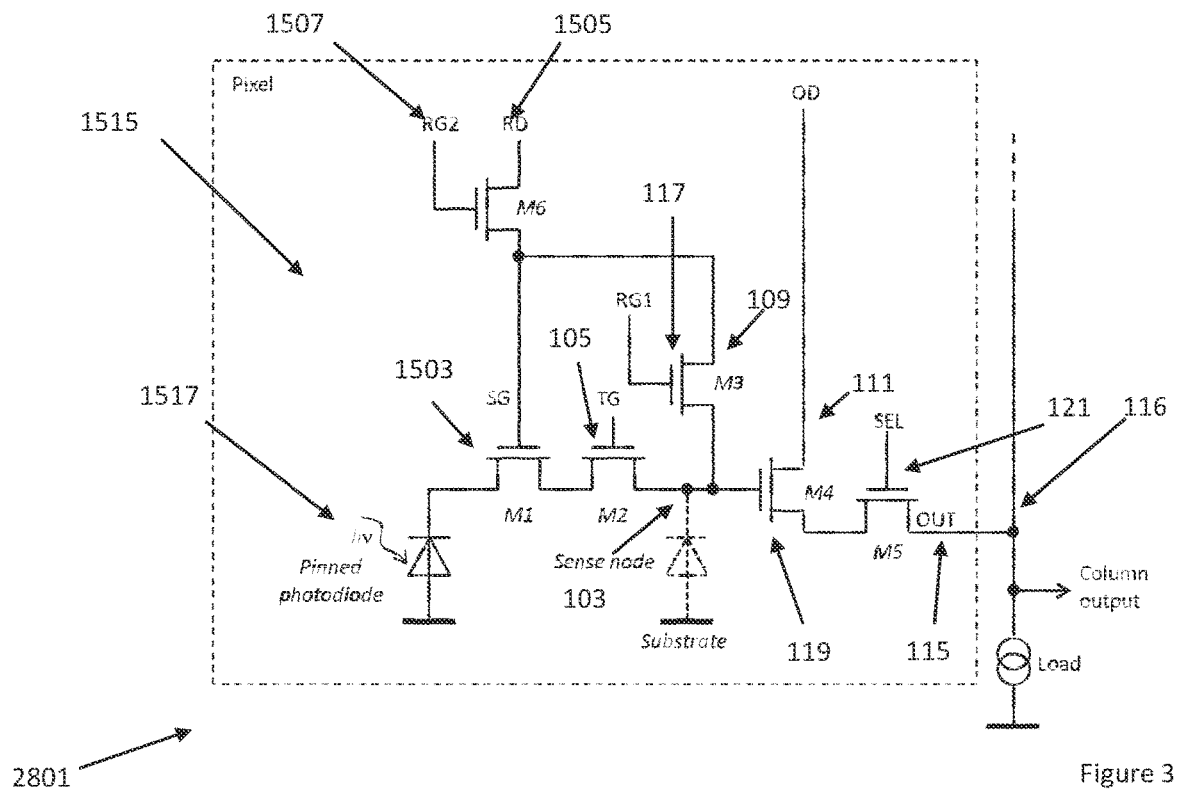
FIG. 33 shows a circuit diagram of a simplified embodiment of the pixel in FIG. 31.
Figure 34:
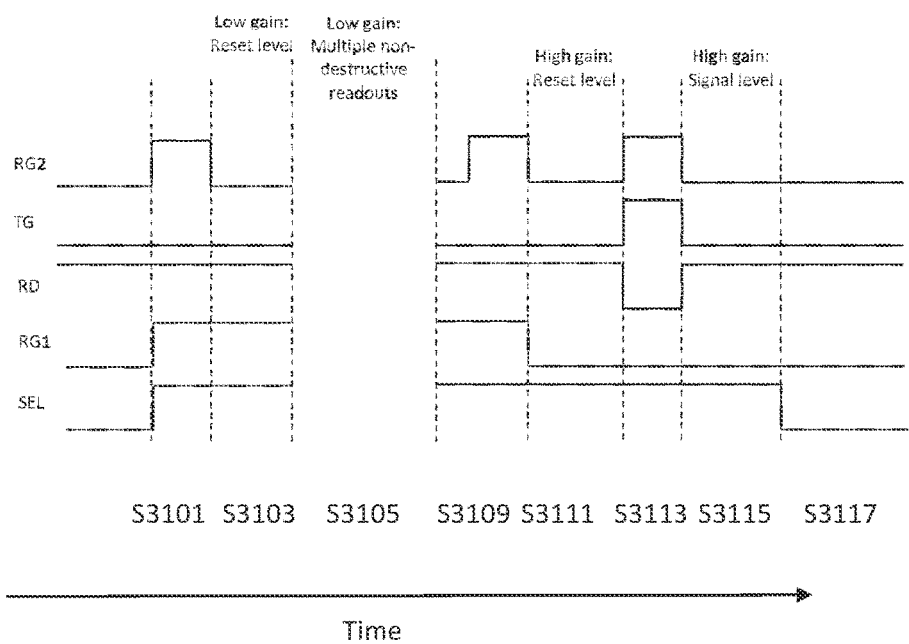
FIG. 34 shows the timing diagram for the pixel of FIG. 33.

In a further simplification of the circuit in FIG. 31, according to an embodiment, the transistor M7 1515 can be removed, resulting in the schematic in FIG. 33 with corresponding timing diagram shown in FIG. 34. The transistor M3 117 is turned on during the readout of the low-gain signal path. To transfer the charge to the sense node 103 the transfer gate TG 105 is turned on simultaneously with the transistor M6 1507.

At the same time the drain voltage at RD 1505 on M6 is lowered externally to substrate potential, and this lowers the potential on the SG 1503 in order to facilitate charge transfer via the TG 105 to the sense node. These steps will now be described in detail.

In step S3101, before collection commences, the SG 1503 is biased to the voltage at the reset drain RD2 1505 by switching the transistor M6 on by a pulse at its gate RG2 1507. As a result, the potential under SG 1503 becomes significantly higher than the PPD pinning potential. This ensures that charge collects under the SG 1503 during charge collection in step S3105. RG1 117 and SEL 121 are also switched on to enable readout at OUT 115. In Step S3103, RG2 is switched off and the reset level is read out.

During charge collection during steps S3105, the potential on SG 1503 can be sampled multiple times on the output OUT 1513, provided that the RG1 117 and SEL 121 are on. This does not interfere with the collection process because the potential on the SG 1503 is not disturbed. The reset voltage level on the SG 1503 is sampled immediately after the RG2 1507 pulse to allow correlated double sampling to be used.

In step S3109, after charge collection, the sense node 103 is reset by a pulse on the transistor RG2 1507 while RG1 117 and SEL 121 remain switched on. In step S3111, after the pulse on RG2 1507, the reset voltage level is sampled on the output OUT 115 by switching off RG1 117.

In step S3113, the charge in the PPD 1517 is transferred to the sense node 103 when the TG 105 is biased high and the drain electrode RD 1505 is connected to a substrate at the same time as RG2 1507 is switched on, thereby lowering the potential on SG 1503. In step S3115, after charge transfer the signal level is sampled on the output OUT 115, due to SEL 121 being biased high.

While certain embodiments have been described, these embodiments have been presented by way of example only, and are not intended to limit the scope of the invention. Indeed, the novel methods, devices and systems described herein may be embodied in a variety of forms; furthermore, various omissions, substitutions and changes in the form of the methods and systems described herein may be made without departing from the spirit of the invention. The accompanying claims and their equivalents are intended to cover such forms or modifications as would fall within the scope and spirit of the inventions.

The invention claimed is:

1. Imaging device comprising:
    a substrate;
    a pinned photodiode formed on the substrate, wherein the pinned photodiode generates a charge that is representative of incident radiation;
    a first circuit defining a first path for measuring the charge and configured to non-destructively produce a first signal representative of the charge generated in the pinned photodiode, wherein the first circuit comprises:
        a sense gate electrode formed on the substrate to capacitively couple the substrate to the charge; and
        a measurement circuit configured to measure a voltage change of the sense gate;
    a second circuit defining a second path for measuring the charge and configured to destructively produce a second signal representative of the charge; and
    a readout circuit common to the first path and to the second path and comprising a source follower,
    wherein the first path has a first conversion gain, the second path has a second conversion gain, and the first conversion gain differs from the second conversion gain.

2. The imaging device of claim 1, wherein the second conversion gain greater than the first conversion gain.

3. The imaging device of claim 2, wherein a conversion gain ratio of the first current gain to the second current gain is in the range 2 to 20.

4. The imaging device of claim 3, wherein the conversion gain ratio is in the range 5 to 10.

5. The imaging device of claim 1, wherein the sense gate electrode is a floating gate electrode.

6. The imaging device of claim 1, wherein the second circuit comprises:
    a sense node formed on the substrate and configured to receive the charge from the pinned photodiode, and
    wherein the measurement circuit is further configured to measure a voltage change of the sense node.

7. The imaging device of claim 6, the imaging device further comprising:
    a first region of the substrate located between the pinned photodiode and the sense node;
    a first gate electrode formed on the substrate, configured to control a transfer of the charge from the pinned photodiode to the first region; and
    a second gate electrode formed on the substrate, configured to control a transfer of the charge between the first region and the sense node,
    wherein the sense gate electrode is formed on the first region of the substrate and capacitively coupled to the first region.

8. The imaging device of claim 6, the imaging device further comprising:
    a first gate electrode formed on the substrate configured to control a transfer of the charge between the pinned photodiode and the sense node, wherein the sense gate electrode is formed on the substrate and is capacitively coupled to the photodiode.

9. The imaging device of claim 7, wherein the first region of the substrate is of a first doping type and wherein the first gate electrode and the second gate electrode are both formed on a region of the substrate of the first doping type.

10. The imaging device of claim 9, wherein the pinned photodiode is formed on a region of the substrate of a second doping type, wherein the first doping type and the second doping type are of opposing polarity.

11. The imaging device of claim 7, wherein the first region of the substrate is a first doping type, the second gate electrode is formed on a region of the substrate having the first doping type, and the first gate electrode is formed on a region of the substrate having a second doping type, wherein the first doping type and the second doping type are of opposing polarity.

12. The imaging device of claim 7, wherein the first gate electrode and the second gate electrode are further configured to control a transfer of the charge from the first region to the pinned photodiode.

13. The imaging device of claim 6, wherein the first circuit is configured to measure the charge via capacitive coupling to the sense gate during the generation of the charge in the pinned photodiode.

14. The imaging device of claim 1 comprising an array of pinned photodiodes and wherein the first circuit and the second circuit are operative to produce signals representative of charge generated in at least one of the pinned photodiodes.

15. The imaging device of claim 14, wherein the first circuit and the second circuit are common to more than one pinned photodiode.

16. The imaging device of claim 14, wherein the first circuit and the second circuit are dedicated to one pinned photodiode.

17. The imaging device of claim 1, wherein the imaging device is configured to discard the second signal when the first signal exceeds a threshold.

18. The imaging device of claim 17, wherein the threshold has a value of the first signal corresponding to the second signal at saturation.

19. A method of operating an imaging device, the method comprising:
receiving radiation incident on a pinned photodiode formed on a substrate;
generating a charge representative of the received radiation;
non-destructively producing a first signal representative of the generated charge at a first conversion gain by measuring a voltage change of a sense gate electrode formed on the substrate and to capacitively couple the substrate to the generated charge;
destructively producing a second signal representative of the generated charge at a second conversion gain, wherein the first conversion gain and the second conversion gain are different; and
reading out the first signal and the second signal through a common readout circuit having a source follower.

20. The method of claim 19, wherein the second signal is produced with a higher conversion gain than the first signal.

* * * * *

UNITED STATES PATENT AND TRADEMARK OFFICE
CERTIFICATE OF CORRECTION

PATENT NO. : 12,068,353 B2
APPLICATION NO. : 17/118809
DATED : August 20, 2024
INVENTOR(S) : Konstantin Stefanov It is certified that error appears in the above-identified patent and that said Letters Patent is hereby corrected as shown below:

In the Specification

Column 1, Line 31, delete "e-=104" and insert -- e- = $10^4$ --.

Column 2, Line 37, delete "grain" and insert -- gain --.

Column 2, Line 39, delete "grain" and insert -- gain --.

Column 4, Line 35, delete "comprising".

Column 7, Line 14, delete "1017 cm-3." and insert -- $10^{17}$ $cm^{-3}$. --.

Column 7, Line 17, delete "1016 cm-3," and insert -- $10^{165}$ $cm^{-3}$, --.

Column 7, Line 19, delete "1018 cm-3." and insert -- $10^{18}$ $cm^{-3}$. --.

Column 9, Line 7, delete "to be" and insert -- is --.

Column 11, Line 54, delete "cm-3" and insert -- $cm^{-3}$ --.

Column 12, Line 20, delete "Si-SiO2" and insert -- Si-$SiO_2$ --.

Column 15, Line 2, delete "Si-SiO2" and insert -- Si-$SiO_2$ --.

Column 15, Line 45, delete "1511".

Column 16, Line 1, delete "Si-SiO2" and insert -- Si-$SiO_2$ --.

Column 16, Line 3, delete "Si-SiO2" and insert -- Si-$SiO_2$ --.

Signed and Sealed this
Fifth Day of November, 2024

Katherine Kelly Vidal
*Director of the United States Patent and Trademark Office*

CERTIFICATE OF CORRECTION (continued)
U.S. Pat. No. 12,068,353 B2

Column 16, Line 10, delete "cm-3" and insert -- $cm^{-3}$ --.

In the Claims

Column 18, Line 37, delete "gain greater" and insert -- gain is greater --.